(12) United States Patent
Hardesty

(10) Patent No.: US 8,838,328 B2
(45) Date of Patent: Sep. 16, 2014

(54) AUTOMOTIVE DIAGNOSTIC SYSTEM

(76) Inventor: Carmen Hardesty, Norton, OH (US)

(*) Notice: Subject to any disclaimer, the term of this patent is extended or adjusted under 35 U.S.C. 154(b) by 137 days.

(21) Appl. No.: 13/539,722

(22) Filed: Jul. 2, 2012

(65) Prior Publication Data

US 2014/0005881 A1 Jan. 2, 2014

(51) Int. Cl.
  *G01M 17/007* (2006.01)
  *G01M 17/00* (2006.01)
  *F02D 41/22* (2006.01)

(52) U.S. Cl.
  CPC .............. *F02D 41/22* (2013.01); *G01M 17/00* (2013.01)
  USPC ........ 701/32.8; 701/29.7; 701/29.8; 701/29.1; 701/31.7

(58) Field of Classification Search
  CPC ............................... F02D 41/22; G01M 17/00
  USPC ..................... 701/29.1, 29.7, 29.8, 32.8, 31.7
  See application file for complete search history.

(56) References Cited

U.S. PATENT DOCUMENTS

| | | | |
|---|---|---|---|
| 5,214,582 A * | 5/1993 | Gray | 701/36 |
| 5,574,645 A * | 11/1996 | Meeker et al. | 701/102 |
| 6,311,162 B1 * | 10/2001 | Reichwein et al. | 705/1.1 |
| 7,103,460 B1 * | 9/2006 | Breed | 701/32.9 |
| 7,254,550 B2 * | 8/2007 | Reichwein et al. | 705/29 |
| 7,818,103 B2 * | 10/2010 | Johansen et al. | 701/22 |
| 8,214,100 B2 * | 7/2012 | Lowrey et al. | 701/29.1 |
| 8,285,439 B2 * | 10/2012 | Hodges | 701/31.5 |
| 2002/0040328 A1 * | 4/2002 | Reichwein et al. | 705/26 |
| 2004/0054503 A1 * | 3/2004 | Namaky | 702/183 |

* cited by examiner

*Primary Examiner* — Mary Cheung
*Assistant Examiner* — Frederick Brushaber
(74) *Attorney, Agent, or Firm* — John D. Gugliotta

(57) ABSTRACT

A system and method is presented for diagnosing problems in a sensor, a vehicle computer and a vehicle sensor wiring harness. The diagnostic system comprises a sensor simulator configured to be selectively coupled to the vehicle computer via a wiring harness during a diagnostic mode, and to eliminate and simulate a known good sensor to the vehicle computer by way of the vehicle sensor wiring harness directly connected therebetween. The system includes an external computer adapted to selectively couple the sensor simulator to the vehicle computer, and a user keypad and memory to receive and store user commands of a selected manufacturer's make, model, year of vehicle, and the function type of the selected sensor, and to enable the user to select or adjust a typical operational value comprising one or more of a voltage, current or resistance operational range values of the selected sensor.

17 Claims, 11 Drawing Sheets

AUTOMOTIVE DIAGNOSTIC SYSTEM

FIELD OF INVENTION

The present invention relates generally to vehicle diagnostic systems and more particularly to an automotive diagnostic system used for diagnosing sensor, sensor wiring harness and related vehicular system problems independent of any connection means to the suspect sensor.

BACKGROUND OF THE INVENTION

Automotive control systems and vehicle sensor systems are employed to sense various environmental and performance related operational conditions in and around the vehicle as well as for providing feedback data from the many actuators, controls and sensors of the vehicle. The operating conditions sensed, and/or the resultant output measurements produced by these sensors systems are usually confined to a predetermined or known operational range of measurement values when they are working properly. In addition, when these vehicle sensors are properly connected to their respective wiring harnesses, and these wiring harnesses are providing adequate continuity, the respective output measurements will also remain confined to within their predetermined or known operational ranges as seen by the vehicle electronics control module (ECM) or on-board vehicle computer.

Two such sensors that provide operating performance data to the ECM, are the individual wheel speed sensors of the automatic braking system (ABS), and the engine oxygen ($O_2$) sensor monitoring the relative percentage of unused oxygen in the combustion process.

Conventional automotive diagnostic equipment has been designed to test some of these electrical system components as may be monitored by the ECM or vehicle computer. However, such diagnostic equipment may be rather expensive and may not be able to ascertain whether the sensor, the interconnection cable between the ECM and the sensor, or the ECM itself is at fault.

Current diagnostic systems may further tend to be inefficient in regard to using more peripheral test equipment than may be required. In addition, present automotive diagnostic systems may not provide system safety or failure prediction information valuable to the user or other such information necessary to diagnose and maintain continued system operations or to avoid an impending automotive sensor system failure.

For design, manufacturing, and applications reasons, the automotive diagnostic systems for diagnosing vehicle sensors and sensor systems discussed above are generally large, complex and/or expensive. Further, the use of these automotive diagnostic systems, supporting equipment and individual sensors also require more system set-up time, additional wiring and added complexity in support of the automotive diagnostic system. Such additional systems, supporting equipment and the associated interface wiring may increase the overall cost and complexity of the system.

Accordingly, to accommodate improved efficiency, lower cost, ease of use and system simplicity goals, there is a need for an automotive diagnostic system that incorporates sensor simulation and sensor failure detection and prediction functions as well as other associated system detection and diagnostic capabilities in an automotive diagnostic system.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

The present invention is directed to an automotive diagnostic system (ADS) for testing the integrity of a sensor or other such detector used in the automotive electrical system of a vehicle, in which the automotive diagnostic system simulates the typical operations of a functional sensor, but without any connection to the suspect sensor (independent of the suspect sensor). The automotive diagnostic system or ADS comprises a sensor simulator that is electrically connected into the automotive electrical system to simulate a functional sensor and therefore directly replaces the suspect sensor (or any user selected sensor). During normal vehicle operations, the vehicle computer or Electronic Control Module (ECM) is typically coupled to a vehicle sensor wiring harness which is coupled to the sensor. During a diagnostic mode of the automotive diagnostic system, the vehicle computer or (ECM) is coupled to the vehicle sensor wiring harness which is coupled to the sensor simulator. Connected at this point in the automotive electrical system, the automotive diagnostic system is therefore configured to diagnose and determine whether problems exist with the sensor, the vehicle computer, or the vehicle sensor wiring harness, or in a combination thereof.

In one embodiment, the automotive diagnostic system is configured for diagnosing problems in one or more of a sensor, a vehicle computer and a vehicle sensor wiring harness. During normal vehicle operations the vehicle sensor wiring harness is coupled between the sensor and the vehicle computer.

The automotive diagnostic system comprises a sensor simulator configured to be selectively coupled to the vehicle computer having the vehicle sensor wiring harness coupled therebetween during a diagnostic mode. The sensor simulator is adapted to simulate an operation of a selected sensor (such as a user selected sensor or a suspect sensor) to the vehicle computer independent of the selected sensor or a connection means between the sensor and the automotive diagnostic system. The ADS further comprises an external computer (non-vehicular computer) coupled to the sensor simulator and adapted for controlling the sensor simulator to selectively couple to the vehicle computer and to simulate the operation of the (user) selected sensor.

The ADS also comprises a user keypad coupled to the external computer adapted to provide user inputs to the external computer; and a memory coupled to the external computer, the memory adapted to store user input data associated with a range of vehicle manufacturer's makes, models, years, sensor function types, and one or more of a voltage, current, and resistance operational range values of the selected sensor to be simulated. The external computer, keypad and memory are adapted to receive and store user input data associated with a selected manufacturers make, model, year vehicle, and the function type of the selected sensor to be simulated using the sensor simulator, and to enable the user to select or adjust a typical operational value of the selected sensor. The automotive diagnostic system is further adapted to determine whether a problem exists in one or more of the sensor, vehicle computer, and the vehicle sensor wiring harness and to diagnose the problem.

In another embodiment the simulated operation of the selected sensor comprises one or more of the voltage, current or resistance operational range values as presented to the vehicle computer.

In one embodiment the automotive diagnostic system is configured and operable to receive one or more initial parametric inputs associated with the selected sensor provided by the sensor or automotive manufacturer.

In one embodiment, the automotive diagnostic system is configured and operable to digitally and wirelessly communicate with one or more or a combination of wireless accessory modules, an RF transceiver, a router, a diagnostic scanner, a remote display, an alarm, an OBD2 compatible connector, an OBD2 compatible cable, and a sensor.

In one embodiment, the automotive diagnostic system comprises a supply voltage monitoring circuit, wherein the automotive diagnostic system is configured to measure the supply voltage with the supply voltage monitoring circuit, and wherein the supply voltage monitoring circuit is operable to provide an indication to the automotive diagnostic system if one of a supply voltage minimum and maximum conditions exists.

In one embodiment, the automotive diagnostic system further comprises an OBD2 connector and connection means to the vehicle computer, and a diagnostic scanner module configured to emulate diagnostic scanner functions and controls to the vehicle computer, wherein the diagnostic scanner module is configured to provide coordination and communications between the vehicle computer and the sensor simulator of the automotive diagnostic system, by way of the OBD2 connector and connection means.

In yet another embodiment, an automotive diagnostic system for a vehicle, comprises a sensor simulator, adapted to be selectively coupled during a diagnostic mode to a vehicle computer for the vehicle having a vehicle sensor wiring harness coupled between the sensor simulator and the vehicle computer; an external computer adapted to control the sensor simulator to be selectively coupled to the vehicle computer by way of the vehicle sensor wiring harness and during the diagnostic mode to simulate the operation of the sensor without a connector for the sensor nor any means of connection between the sensor and the automotive diagnostic system; a user keypad coupled to the external computer, and adapted to receive user commands associated with a selected manufacturers make, model, year vehicle, and the function type of the sensor to be simulated by the sensor simulator, and to enable the user to select or adjust a typical operational value of the sensor; and a memory device coupled to the external computer, and adapted to store a range of vehicle manufacturer's makes, models, years, sensor function types, and voltage, current or resistance operational range values of the sensor to be simulated; wherein during a typical vehicle operations mode the vehicle sensor wiring harness is coupled between the vehicle computer and a sensor which is to be simulated.

In one aspect, a method is disclosed for diagnosing problems in a suspect sensor, a vehicle sensor wiring harness and a vehicle computer without any means of connection to the sensor using an automotive diagnostic system. The diagnostic system comprises a sensor simulator configured to be selectively coupled to the vehicle computer by way of the vehicle sensor wiring harness coupled therebetween during a diagnostic mode. The method comprises disconnecting the suspect sensor from the vehicle sensor wiring harness of the vehicle; connecting the vehicle sensor wiring harness between the sensor simulator and the vehicle computer; receiving user commands of one or more of a manufacturers make, model, year vehicle, and function type, and one or more voltage, current or resistance operational range values associated with the suspect sensor. The method further comprises selecting or adjusting the sensor simulator to a typical operational range value for a typical operational sensor; generating and outputting at least one of the one or more operational range values and a simulation from the sensor simulator to the vehicle computer by way of the vehicle sensor wiring harness during the diagnostic mode; diagnosing that a problem exists in the suspect sensor and that the vehicle computer and the vehicle sensor wiring harness are OK, by determining if the simulated operation of the suspect sensor as presented to the vehicle computer indicates that the suspect sensor is OK. The method also comprises diagnosing that a problem exists in the vehicle sensor wiring harness or in the vehicle computer, by determining if the simulated operation of the suspect sensor as presented to the vehicle computer indicates that the suspect sensor is not OK.

To the accomplishment of the foregoing and related ends, the following description and annexed drawings set forth in detail certain illustrative aspects and implementations of the invention. These are indicative of but a few of the various ways in which the principles of the invention may be employed. Other aspects, advantages and novel features of the invention will become apparent from the following detailed description of the invention when considered in conjunction with the drawings.

DETAILED DESCRIPTION OF THE INVENTION

Figure 1:
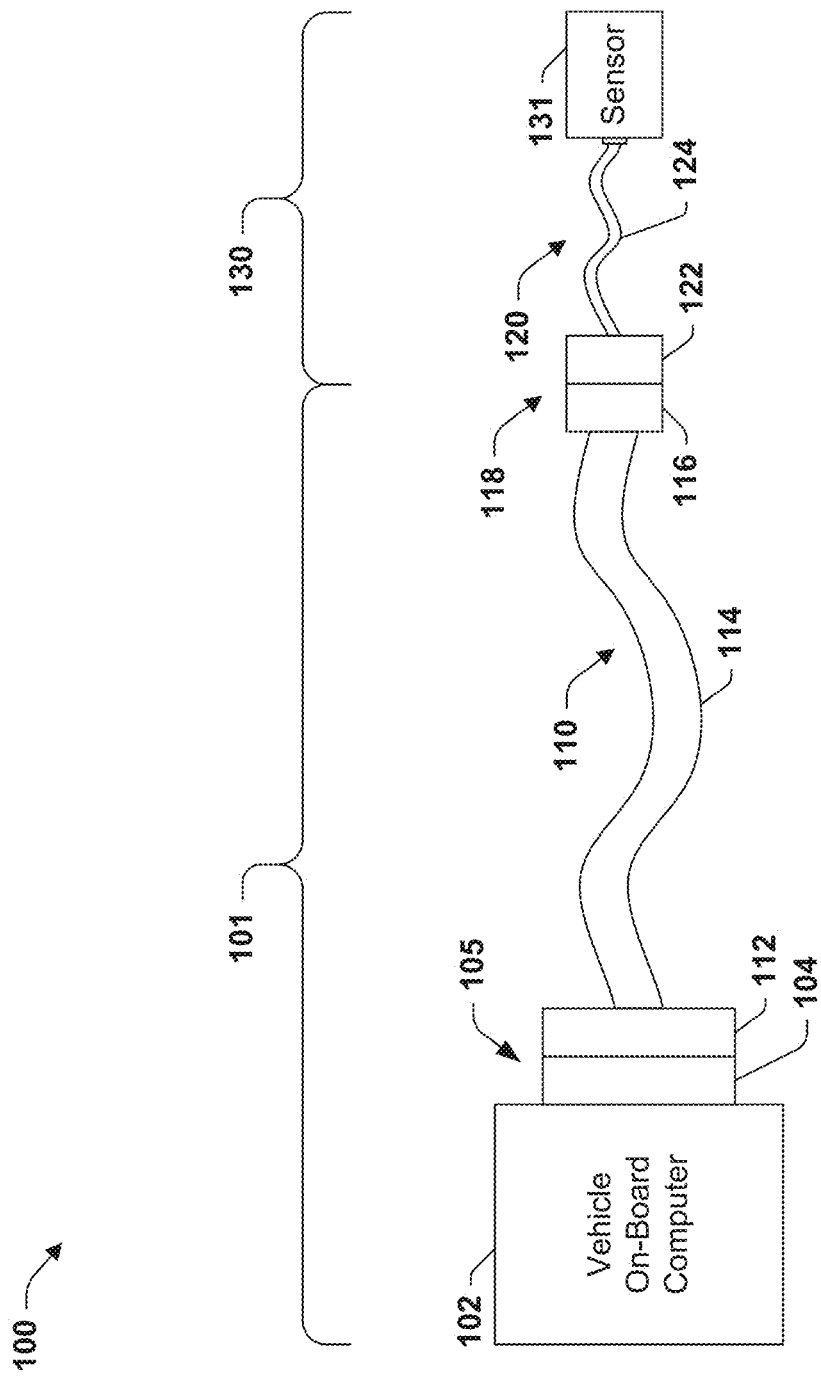
FIG. 1 is a simplified diagram of a portion of a typical prior art automotive sensor system of a vehicle, wherein a sensor monitoring system is used to monitor one or more sensors of a sensor system, and wherein sensor data from the vehicle is supplied to a vehicle on-board computer for monitoring and/or controlling various functions and parameters of vehicle operations.

The present invention will now be described with reference to the attached drawings, wherein like reference numerals are used to refer to like elements throughout. The invention relates to an automotive diagnostic system (ADS) and method for diagnosing problems in a suspect sensor (or sensor system), a vehicle sensor wiring harness and a vehicle computer of a vehicle without any connection to the suspect sensor. In one embodiment, the automotive diagnostic system of the present invention accomplishes this goal during a diagnostic mode, by eliminating the sensor and instead simulating the sensor using an automotive diagnostic system that comprises a sensor simulator configured to be selectively coupled to the vehicle computer by way of the vehicle sensor wiring harness which is directly connected therebetween. In one embodiment, the sensor simulator is adapted to simulate an operation of the sensor system to the vehicle computer, and to physically replace the sensor system.

The ADS further comprises an external computer coupled to the sensor simulator adapted for controlling the sensor simulator to selectively couple to the vehicle computer and to simulate the operation of the selected sensor. The ADS further comprises a user keypad coupled to the external computer adapted to provide user inputs to the external computer. The ADS further comprises a memory coupled to the external computer, adapted to store user input data associated with a range of vehicle manufacturer's makes, models, years, sensor function types, and one or more of a voltage, current, and resistance operational range values of the selected sensor to be simulated. Further, the exemplary automotive diagnostic system may also include a user interface having a display for viewing various vehicle status conditions and sensor preset values, and may include pushbuttons for selecting various modes or for entering the sensor preset values.

In one embodiment of the automotive diagnostic system, the external computer, keypad and memory are adapted to receive and store user input data associated with a selected manufacturers' make, model, year vehicle, and the function type of the selected sensor to be simulated by the sensor simulator. The keypad also enables the user to enter, select or adjust a typical operational value or range of values, or one or more High/Low limits of the selected sensor. The automotive diagnostic system is also adapted to determine whether a problem exists in one or more of the sensor or sensor system, the vehicle computer, and the vehicle sensor wiring harness, and to diagnose a likely problem therein. The methodology used in this diagnosis will be discussed further infra in reference to the following figures.

When used in a typical automotive vehicle application, for example, one goal of the automotive diagnostic system of the present invention is to simulate a known good sensor or sensor system. Conventionally, the above identified diagnostic capabilities or functions may require the use of separate diagnostic equipment, which add system complexity as well as cost for the added supporting hardware (e.g., power supplies, DVM's, oscilloscopes, good sensors, interconnect cabling, analyzers, etc.).

The automotive diagnostic system communications with a supporting analyzer or accessory modules may be provided, for example, on a four-wire serial bus.

Initial parameters or calibration data of the specific elements used in the sensor(s) of a sensor system or for the automotive diagnostic system may be supplied by the manufacturer or otherwise ascertained in another manner and supplied by a plug-in module, memory chip, or may be preloaded or downloaded into the ADS memory. These parameters may be useful for increasing the accuracy of the sensor diagnostics, for calibration purposes, or establishing various limits and setpoints. In addition, inputting one or more predetermined acceptable or expected levels of vehicle or system thermal decay rate time constants may be useful for identification of specific medium densities, for identification of sensor degradation levels and failure predictions, or to limit the range of set points to match appliance limitations. In order to better appreciate one or more features of the invention, several exemplary implementations of the automotive diagnostic system and a temperature, pressure and presence detection system, the vehicle control and economizing algorithm method are hereinafter illustrated and described further in association with the following figures.

FIG. 1 illustrates a simplified diagram of a portion of a conventional prior art automotive sensor system 100 of a vehicle, wherein a sensor monitoring system 101 is used to measure and/or monitor one or more sensors 131 of a sensor system 130, and wherein sensor data from the vehicle is supplied to a vehicle on-board computer 102 for monitoring and/or controlling various functions and parameters of vehicle operations. Typical automotive sensor systems may include engine air and water temperatures, oxygen and fuel sensors, a TPS (throttle position sensor), and a wheel speed sensor at each wheel of an antilock braking systems, for example. Each sensor system may include one or more sensors, interconnecting cable wiring, and one or more sensor connectors for plugging or mating into the automotive electrical system. The prior art sensor monitoring system 101 of FIG. 1, for example, comprises an Electronic Control Module (ECM) or vehicle on-board computer 102 that is coupled via a vehicle sensor wiring harness 110 to a sensor cable 120 that terminates at a sensor 131 of the sensor system 130. The sensor system 130 may comprise a sensor 131, a sensor cable 120 and a sensor connector 122, for example. During normal vehicle operations, the vehicle computer 102 is typically coupled to a vehicle sensor wiring harness 110 which is coupled to the sensor system 130.

The sensor cable 120 comprises sensor cable wiring 124 which terminates into a sensor connector 122 at a computer side and into the sensor 131 at a sensor side. The sensor connector 122 terminating the sensor cable 120 in a typical automotive sensor system 100, is connected directly to a vehicle sensor wiring harness 110 which plugs into the vehicle on-board computer or ECM 102. The vehicle sensor wiring harness 110 comprises harness wiring 114 terminating at a sensor-side connector 116 which plugs into the sensor system 130 at sensor-side connector 116, and terminating at a computer side connector 112 which plugs into the vehicle on-board computer 102 at a computer connector 104. Collectively, computer side connectors 104/112 comprise a computer/harness interface 105, while the sensor side connectors 116/122 collectively comprise a harness/sensor interface 118.

The ECM 102 of the conventional partial automotive sensor system 100 of FIG. 1 monitors information or data from the sensor 131 in a variety of forms ranging from analog or digital to pulse patterns of current, voltage, or resistance measurements. During typical or nominal sensor monitoring activities and/or measurements, the output measurements of the sensor will typically remain within predictable limits, such as within a range of values between a high limit 510 and a low limit 514 as shown by signal 512 in FIG. 5. However, when a sensor fails or begins to fail, for example, the monitored sensor will typically fail toward a state that is either above the high limit 510 or below the low limit 514 values. This is often the case with digital output sensors as well, because the outputs tend to either fail to a high or low state that is beyond the typical output voltage range, and will also then be unable to output an expected state transition in response to a sensed condition or state change.

Figure 2:
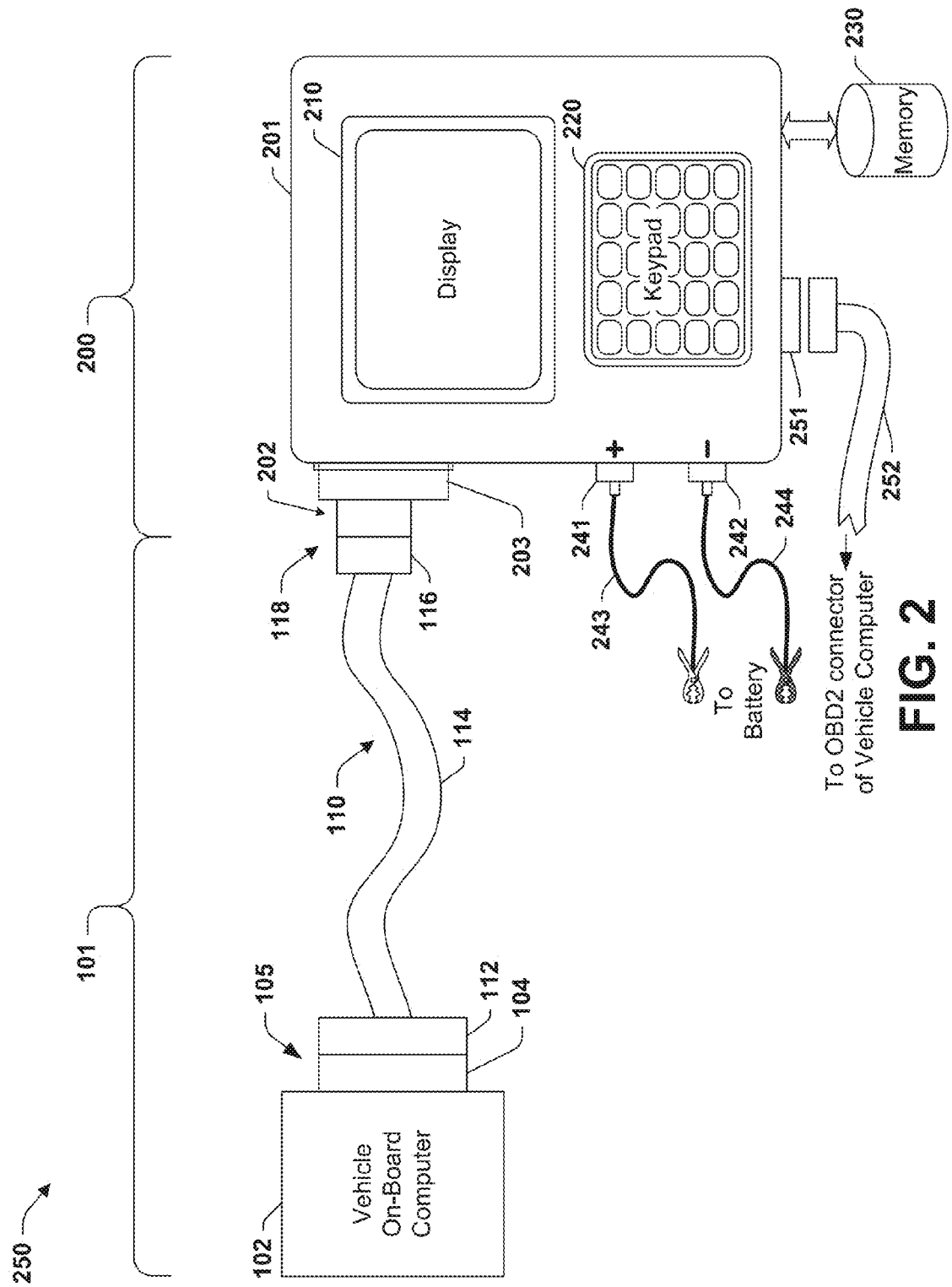
FIG. 2 is a simplified diagram of an automotive test system comprising an exemplary automotive diagnostic system connected to a conventional vehicle sensor monitoring system; the exemplary automotive diagnostic system used in accordance with one embodiment to simulate one or more operations, functions and parameters of a sensor system in a vehicle, and to physically replace the sensor system, for example, comprising a sensor, a sensor cable and a sensor connector.

FIG. 2 illustrates a simplified diagram of an automotive test system 250 comprising an exemplary automotive diagnostic system 200 connected to a conventional vehicle sensor monitoring system 101. The exemplary automotive diagnostic system (ADS) 200 is used in accordance with one embodiment to simulate one or more operations, functions and parameters of a sensor system (e.g., 130) in a vehicle, and to physically & functionally replace the sensor system 130, thereby eliminating any connection to the sensor system 130. Thus ADS 200, in one embodiment, physically & functionally replaces and simulates sensor system 130 which may comprise sensor(s) 131, sensor cable 120 and sensor connector 122, for example.

By simulating a known good or functioning sensor system 130, the automotive diagnostic system ADS 200 is configured to diagnose a problem that may exist in the sensor system or other associated components of the automotive electrical system of a vehicle. ADS 200 simulates the typical operations of a functional sensor, but without any connection to the suspect sensor (independent of the suspect sensor). ADS 200, for example, comprises a sensor simulator that is electrically connected into the automotive electrical system to simulate a known good or functional sensor and therefore functionally replaces the suspect sensor (or any other user selected sensor).

During normal vehicle operations, the vehicle computer 102, is typically coupled to a vehicle sensor wiring harness 110 which is coupled to the sensor system 130. During a diagnostic mode of the automotive diagnostic system 200, the vehicle computer 102 is coupled to the vehicle sensor wiring harness 110 which is coupled to the sensor simulator 200. Connected at this point in the automotive electrical system, the automotive diagnostic system 200 is therefore configured to diagnose and/or determine whether a problem exists with the sensor 131 or sensor system 130, the vehicle computer 102, or the vehicle sensor wiring harness 110, or any combination thereof.

FIG. 2 further illustrates that ADS 200 comprises a diagnostic system controller 201 which can be coupled to the harness/sensor interface 118 by way of a sensor-specific plug adapter 202. In one embodiment, a variety of similar sensor-specific plug adapters may be utilized to adapt between a universal plug and configuration 203 (at the ADS 200 side), and a suitable sensor specific plug configuration (on the vehicle sensor wiring harness side) that matches a variety of other sensors and corresponding vehicle sensor wiring harnesses. FIG. 2 also illustrates that ADS 200 may comprise a display 210 and a keyboard 220 for display and inputs to and from a user, and a memory 230 to store user inputs/outputs as well as test and manufacturers data, parameters, settings, vehicle conditions, results, trends, diagnoses, etc.

FIG. 2 also illustrates that the exemplary automotive diagnostic system 200 may further comprise battery terminal plugs 241 (+12V) and 242 (Gnd) for connection via battery cables 243 & 244 to the vehicle battery, such as the vehicle's 12 Volt battery. Alternately, automotive diagnostic system 200 may further comprise and be configured with an OBD2 compatible receptacle 251 adapted for connection to the industry standard OBD2 plug at the vehicle computer via an OBD2 compatible cable 252, for example.

Figure 3A:
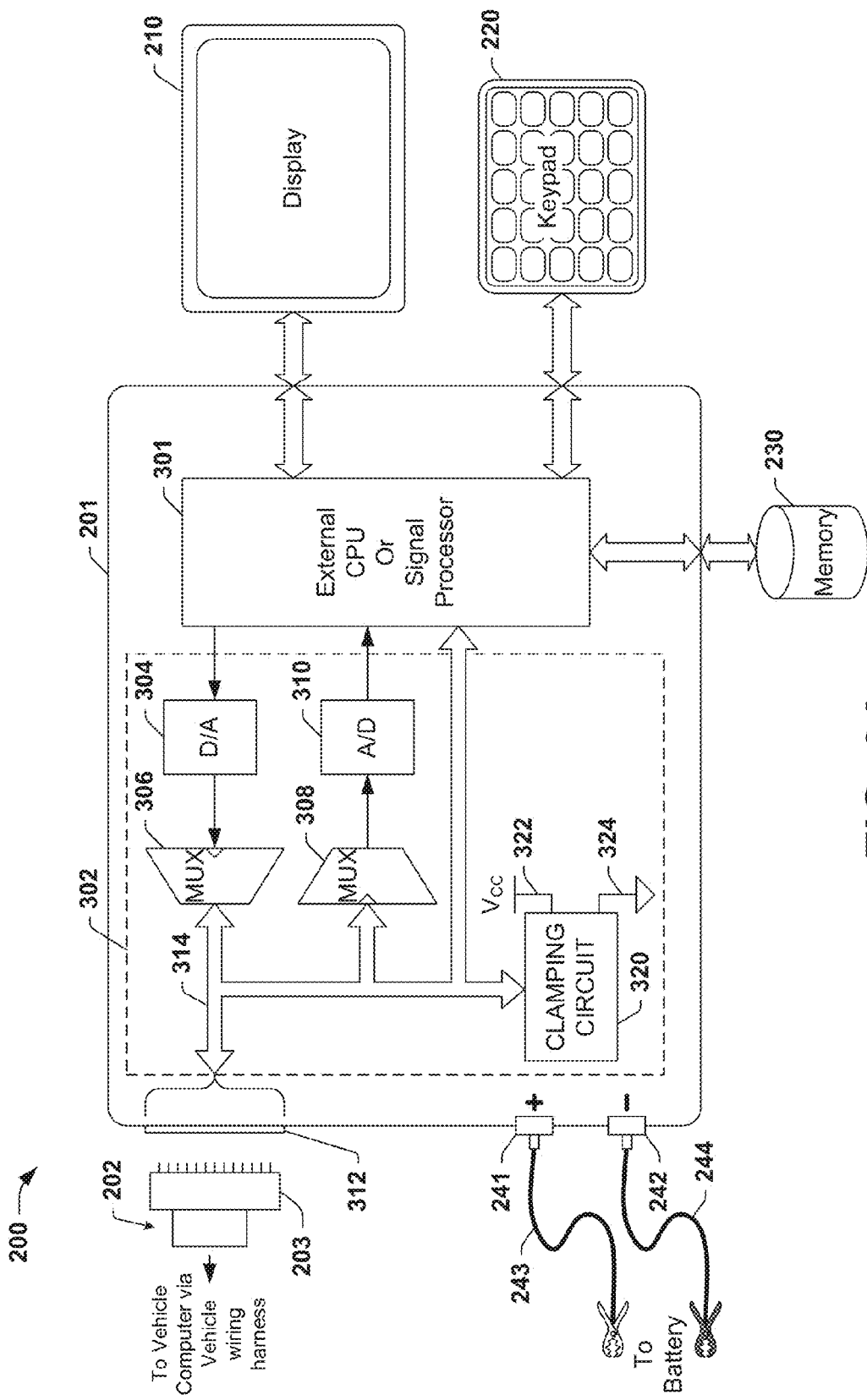
FIGS. 3A & 3B are a simplified block diagrams of an equivalent circuit of exemplary automotive diagnostic systems, such as that of FIG. 2, used in accordance with one embodiment of the present invention and further including a sensor specific plug adapter used to interconnect the automotive diagnostic system to a vehicle sensor wiring harness of a sensor monitoring system.
Figure 3B:
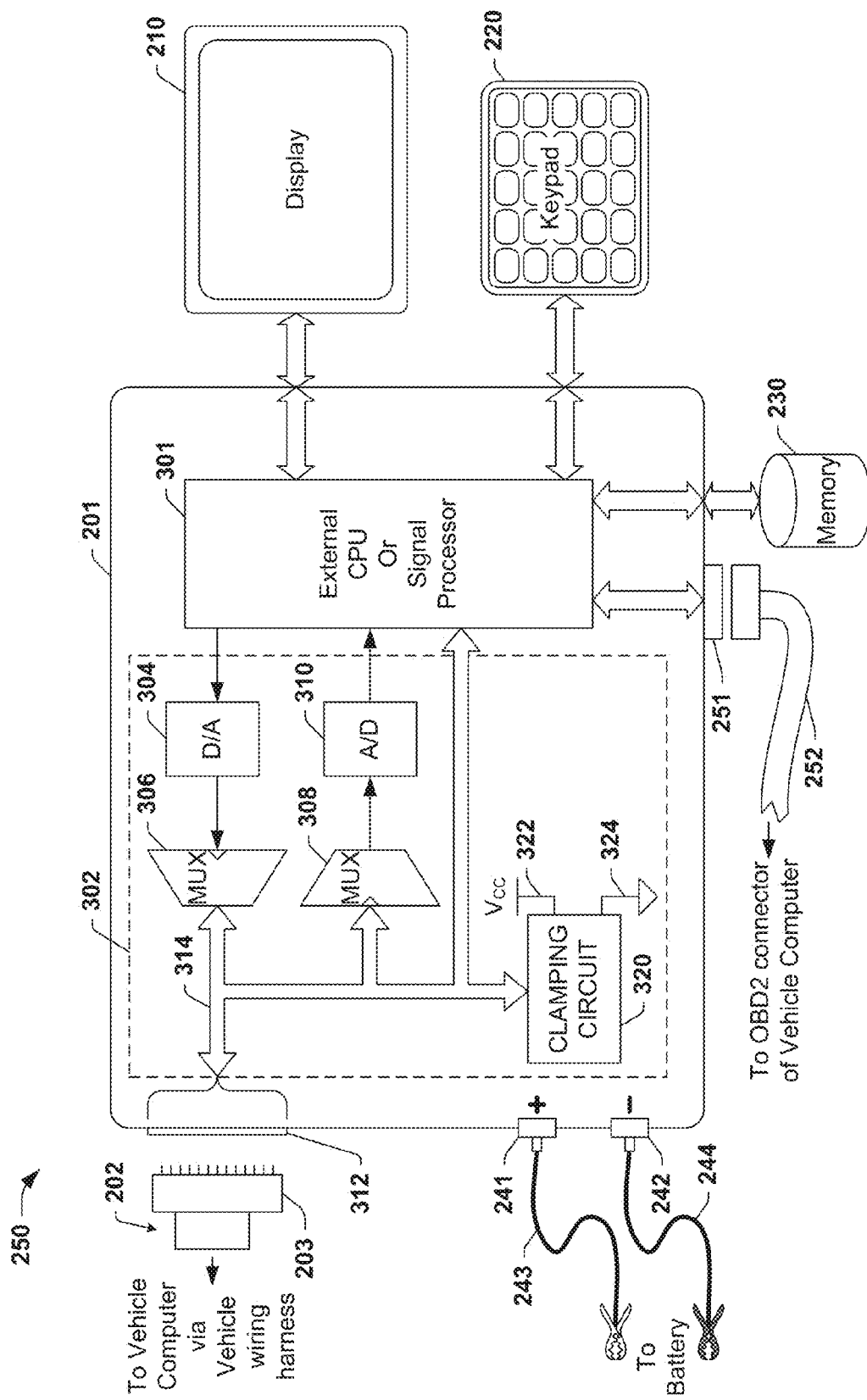

FIGS. 3A & 3B illustrate simplified block diagrams of an equivalent circuit of an exemplary automotive diagnostic systems 200 and 250, such as that of FIG. 2, used in accordance with one embodiment of the present invention and further including a sensor specific plug adapter 202 used to interconnect the automotive diagnostic systems 200/250 to a vehicle sensor wiring harness 110 of a sensor monitoring system 101.

The automotive diagnostic system 200 comprises a sensor simulator 302 configured to be selectively coupled to the vehicle computer 102 having the vehicle sensor wiring harness 110 coupled therebetween during a diagnostic mode. The sensor simulator 302 is adapted to simulate an operation of a selected sensor (such as a user selected sensor or a suspect sensor 131 of sensor system 130) to the vehicle computer 102 independent of the selected sensor or a connection means between the sensor and the automotive diagnostic system 200. The ADS 200 further comprises an external computer 301 (non-vehicular computer) coupled to the sensor simulator 302 and adapted for controlling the sensor simulator 302 to selectively couple to the vehicle computer 102 and to simulate the operation of the (user) selected sensor.

The ADS 200 of FIG. 3A also comprises a user keypad 220 coupled to the external computer 102 adapted to provide user inputs to the external computer 301; and a memory 230 coupled to the external computer 301, the memory 230 adapted to store user input data associated with a range of vehicle manufacturer's makes, models, years, sensor function types, and one or more of a voltage, current, and resistance operational range values of the selected sensor (e.g., 131) to be simulated. The external computer 301, keypad 220 and memory 230 are adapted to receive and store user input data associated with a selected manufacturers make, model, year vehicle, and the function type of the selected sensor to be simulated using the sensor simulator 302, and to enable the user to select or adjust a typical operational value of the selected sensor (e.g., 131). The automotive diagnostic system 200 is further adapted to determine whether a problem exists in one or more of the sensor (e.g., 131), the vehicle computer 102, and the vehicle sensor wiring harness 110 and to diagnose the problem.

The ADS 200 of FIG. 3A also illustrates that the sensor simulator 302 may further comprise one or more digital to analog converters D/A 304 and one or more multiplexors MUX 306 configured to synthesize or simulate the output of a user selected sensor to an input/output bus I/O Bus 314, which is output from sensor simulator 302 at receptacle 312 of the diagnostic system controller 201. The external CPU or signal processor 301 is configured to provide one or more of a digital level, sequence, or stream of data to D/A 304 to simulate any sensor output desired. Receptacle 312 may be configured with a universal pin configuration to mate with universal plug 203 of the sensor-specific plug adapter 202, whose output pin configuration is customized to be a pin-for-pin replacement for at least the sensor being simulated. Thus, receptacle 312 and mating universal plug 203 have a fixed pin configuration that is common or universal to all sensor connector (e.g., 122) pin configurations, and a variety of respective sensor-specific plug adapters 202. Sensor simulator 302 may further comprise one or more analog to digital converters A/D 310 and one or more multiplexors MUX 308 configured to receive data or instructions from the vehicle on-board computer 102 or from a sensor, in another embodiment. It is further appreciated that MUX's 306 & 308 may further comprise buffers and/or buffer-drivers, for example, to drive, isolate, or level translate signals therebetween.

External CPU or signal processor 301 is configured to communicate with display 210, keypad/keyboard 220, memory 230, and the vehicle computer, to input, store, retrieve, output and display all data, test results, diagnoses, hints, sensor parameters, manufacturers vehicle make, model and year of vehicle and associated sensor settings, etc.

FIGS. 3A & 3B also illustrate that the exemplary automotive diagnostic systems 200 and 250 may further comprise battery terminal plugs 241 (+12V) and 242 (Gnd) for connection via battery cables 243 & 244 to the vehicle battery, such as the vehicle's 12 Volt battery. Alternately, as shown in automotive diagnostic system 250 of FIG. 3B, the diagnostic system controller 201 may further comprise and be configured with an OBD2 compatible receptacle 251 adapted for connection to the industry standard OBD2 plug at the vehicle computer via an OBD2 compatible cable 252, for example.

Figure 4:
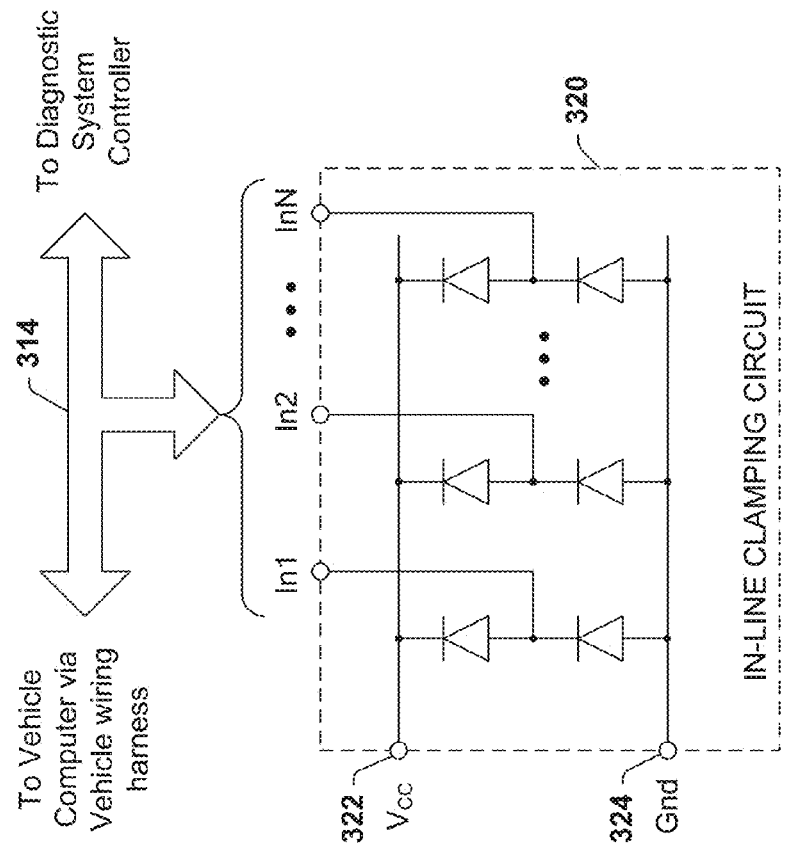
FIG. 4 is a simplified schematic diagram of a clamping circuit such as may be used in or in-line with the exemplary automotive diagnostic system of FIGS. 2 and 3A/3B for clamping overvoltages and undervoltages that may be present in the automotive system in accordance with an embodiment of the present invention.

FIG. 4 illustrates a simplified schematic diagram of a clamping circuit 320 such as may be used in or in-line with the exemplary automotive diagnostic system 200/250 of FIGS. 2 and 3A/3B for clamping overvoltages and undervoltages that may be present in the automotive system in accordance with one embodiment of the present invention. FIGS. 3A/3B and 4 illustrate that the clamping circuit 320, in one embodiment, is clamped to power supply rails Vcc 322 and Gnd 324, for example, or any other appropriate supply voltages used by the sensor simulator and/or diagnostic system controller 201. Thus, the signals In1, In2 . . . InN of input/output bus 314 will be clamped or shunted to power supply voltages Vcc 322 and Gnd 324, for example.

FIGS. 5-8 are simplified plots 500, 600, 700 & 800, respectively, of exemplary sensor output vs. time diagrams, comprising operational ranges of voltages, resistances or milliamperes, for example, wherein the range values of known good sensors will remain between exemplary High and Low limits, such as may be simulated by the sensor simulator of the automotive diagnostic systems of FIGS. 2 and 3A/3B in accordance with another embodiment of the present invention.

Figure 5:
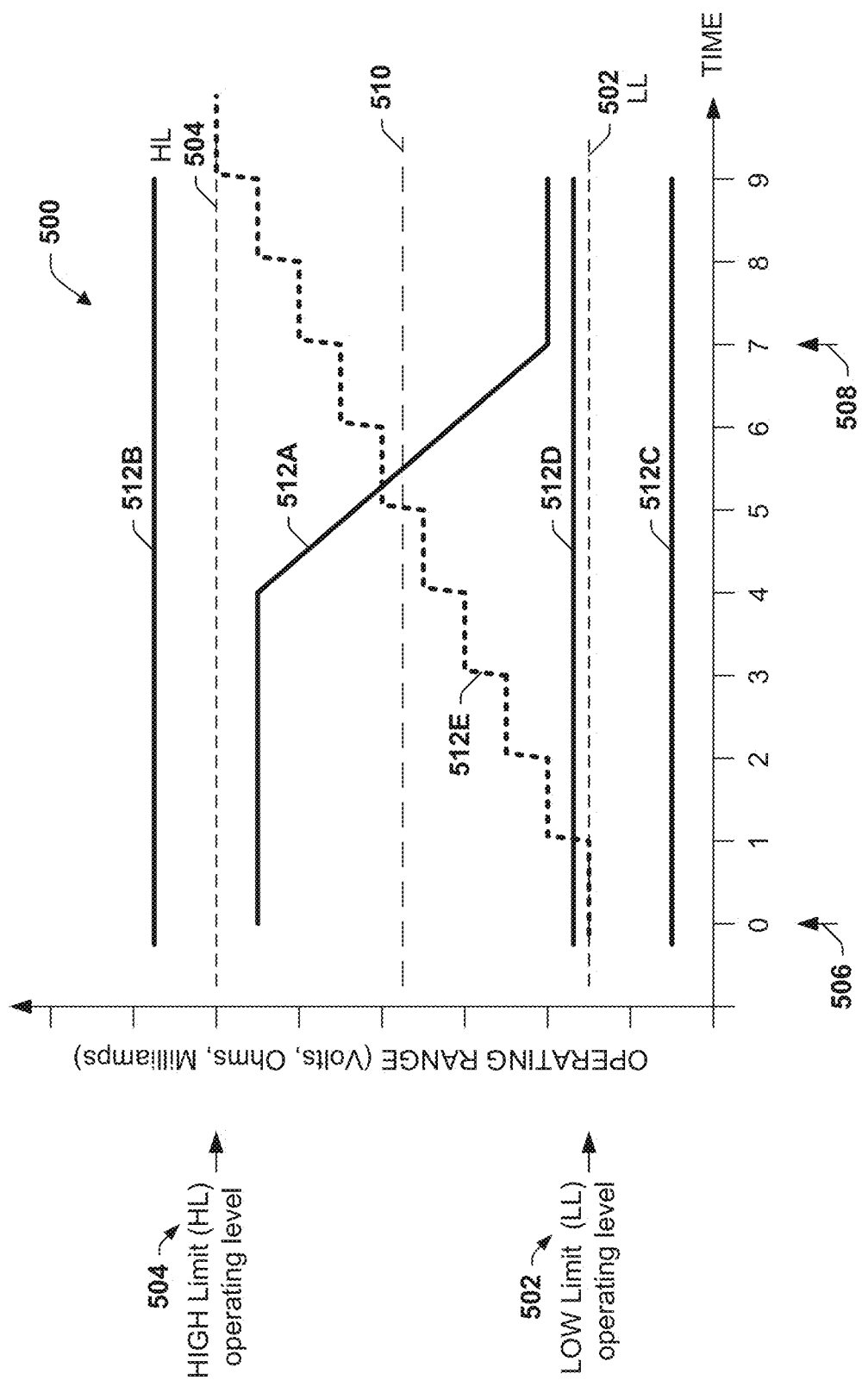
FIGS. 5-8 are simplified plots of exemplary sensor output vs time diagrams, comprising operational ranges of voltages, resistances or milliamperes, for example, wherein the range values of known good sensors will remain between exemplary High and Low limits, such as may be simulated by the sensor simulator of the automotive diagnostic systems of FIGS. 2 and 3A/3B in accordance with another embodiment of the present invention.

For example, plot 500 of FIG. 5 illustrates a general outline of sensor outputs, how sensors are typically monitored and how their individual measurements may be diagnosed. Plot 500 further illustrates that an exemplary sensor may have it's voltage (volts), resistance (ohms) or current (milliamps) output level monitored. Since one goal of the ADS 200/250 is to simulate the output of a know good sensor (e.g., such as may be presented to the vehicle computer or on-board computer 102), this output level may be required to either remain steady at a known level, to change from one level to another at a known or typical rate, or to appear as a pulse string, for example. For example, the known good sensor that is being simulated may be best represented as remaining fixed near a known average, typical or median level such as typical level 510. Although some exceptions may exist, the output levels of known good sensors typically will remain between exemplary high and low limits such as High limit HL 504 (e.g., set below a supply voltage maximum or +12V) and Low limit LL 502 (e.g., set above a supply voltage minimum or Gnd), for example. The reason for setting these limits, is that output excursions beyond these high and low limits, typically indicates a shorted, open or otherwise failed sensor. Also, a sensor that may be expected to provide an output which transitions from one level to another, or to provide a pulse string, but which does not accomplish these expected outputs, may also indicate a failed sensor.

For example, sensor output plot 512A, illustrates an exemplary simulated output of a known good sensor which provides an output level transition, from an initial high output level at time "0" 506 through time "4", transitioning between times "4-7", down to a final sensor output level at time "7" 508 through time "9". The sensor simulator 302 of ADS 200/250, for example, may be used to simulate this and all the following sensor outputs discussed herein. Sensor output plots 512B and 512C may illustrate sensor outputs of a failed sensor that is unable to remain between exemplary High limit HL 504 and Low limit LL 502. Sensor output plot 512D illustrates another possible sensor output which remains steady at a low level, and remains between exemplary high and low limits, HL 504 and LL 502 respectively. Output plot 512E illustrates a simulated sensor output forming a "Staircase" waveform that sweeps in steps from a lowest allowable level LL 502 to a highest allowable level HL 504 in discrete time increments between time "0" and time "9". Such an exemplary staircase sweep output plot 512E may be particularly useful to test all possible levels of respective voltage, current or resistance as inputs presented to the vehicle computer 102 for a given sensor 130/131, for example, to verify that the vehicle computer is responding correctly or appropriately.

For example, a separate diagnostic scanner or analyzer (e.g., a Snap-On scanner) (not shown), or the OBD2 Cable 252 of the ADS 200/250 may be plugged into an OBD2 port of the vehicle computer 102 in order to monitor the response of the vehicle computer 102 during the sensor simulation of the staircase sweep output 512E. Then, if the vehicle computer 102 fails to provide an appropriate response to each step of the staircase waveform output from the ADS 200/250, the user may be led to conclude that the vehicle computer 102, or that particular sensor input provided by the vehicle sensor wiring harness 110, or the vehicle sensor wiring harness 110 has failed. However, if all harness 110 and vehicle computer 102 preliminary voltage and resistance checks pass OK before the simulation, then the vehicle computer 102 may be considered more suspect of failure.

Figure 6:
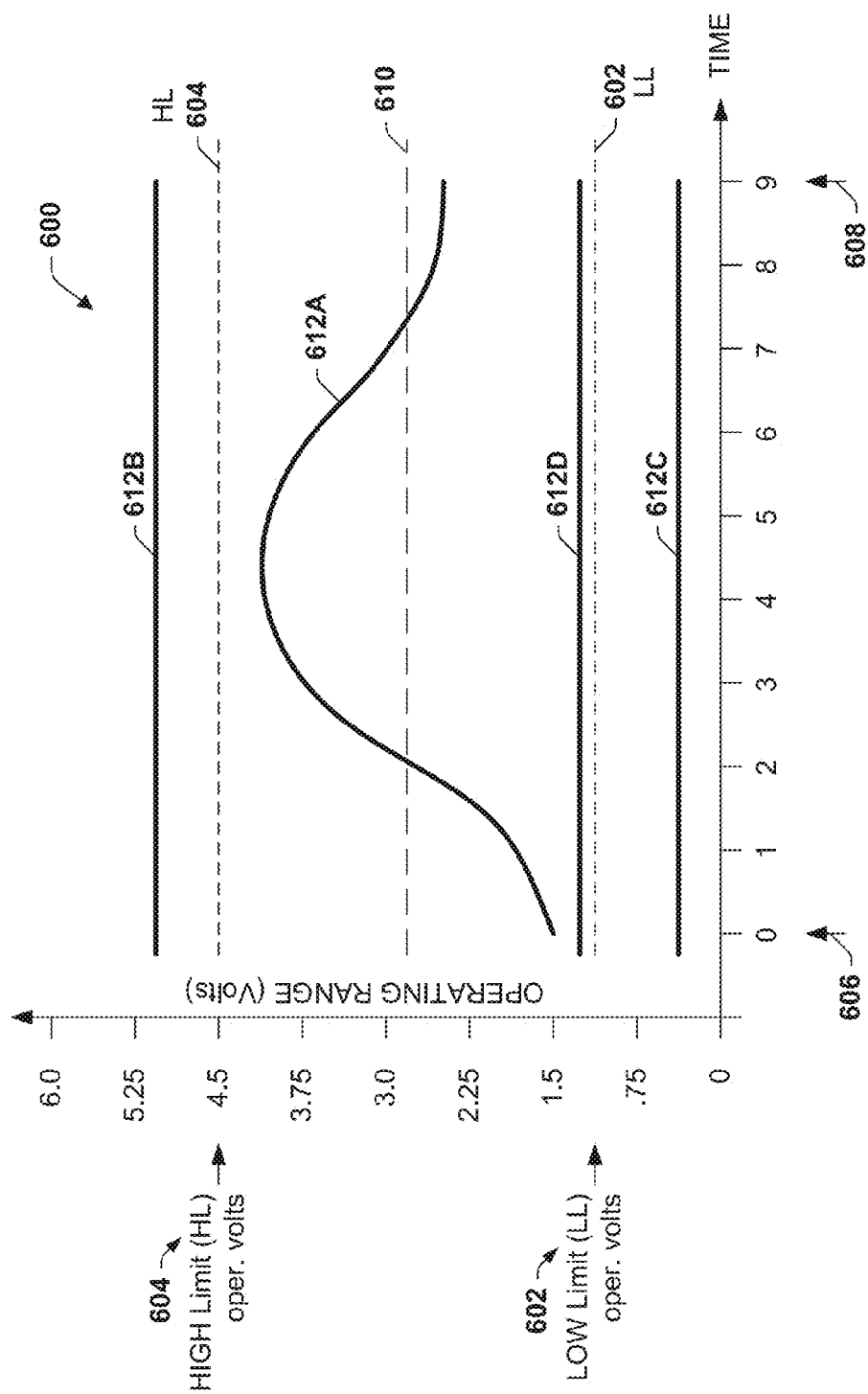

Plot 600 of FIG. 6 illustrates a more specific sensor example, such as a Mass Air Flow (MAF) sensor and several possible voltage output vs. time plots, simply for example. For example, LL 602 may be established at about 1.1 Volts, and HL 604 at about 4.5 Volts, and a typical or average voltage level 610 at about 2.8 Volts. For example, sensor output plot 612A, illustrates that initially at time "0" 606, the MAF sensor is indicating that the engine is aspirating a lower level of air flow such as at idle or low engine RPM's. Thereafter, the MAF sensor indicates an air flow that peaks around time "4"-"5", (e.g., indicating a higher engine RPM), and then finally reduces down just below a median or average level 610 and final level 608 at time "9" (e.g., indicating just under a mid-range RPM). Although the MAF or another such sensor, in this example, may be calibrated to produce about 1.1 Volts at the low limit LL 602, and 4.5 Volts at the high limit HL 604, a low limit LL 602 of 0 Volts, and a high limit HL 604 of 5.5 Volts, may also be utilized or required either by the on-board computer (e.g., 102), or as simulated by ADS 200/250.

Sensor output plot 612B and 612C illustrate possible failed MAF sensor outputs not remaining between exemplary High limit HL 604 and Low limit LL 602. Sensor output plot 612D illustrates a possible MAF sensor output which remains steady at a low level, while remaining between exemplary high and low limits, HL 604 and LL 602 respectively. Again, the known good sensor that is being simulated by ADS 200/250, may also be represented as remaining near a known typical, median or average level 610, or transitioning between two or more known levels similar to plot 512A of FIG. 5.

Figure 7:
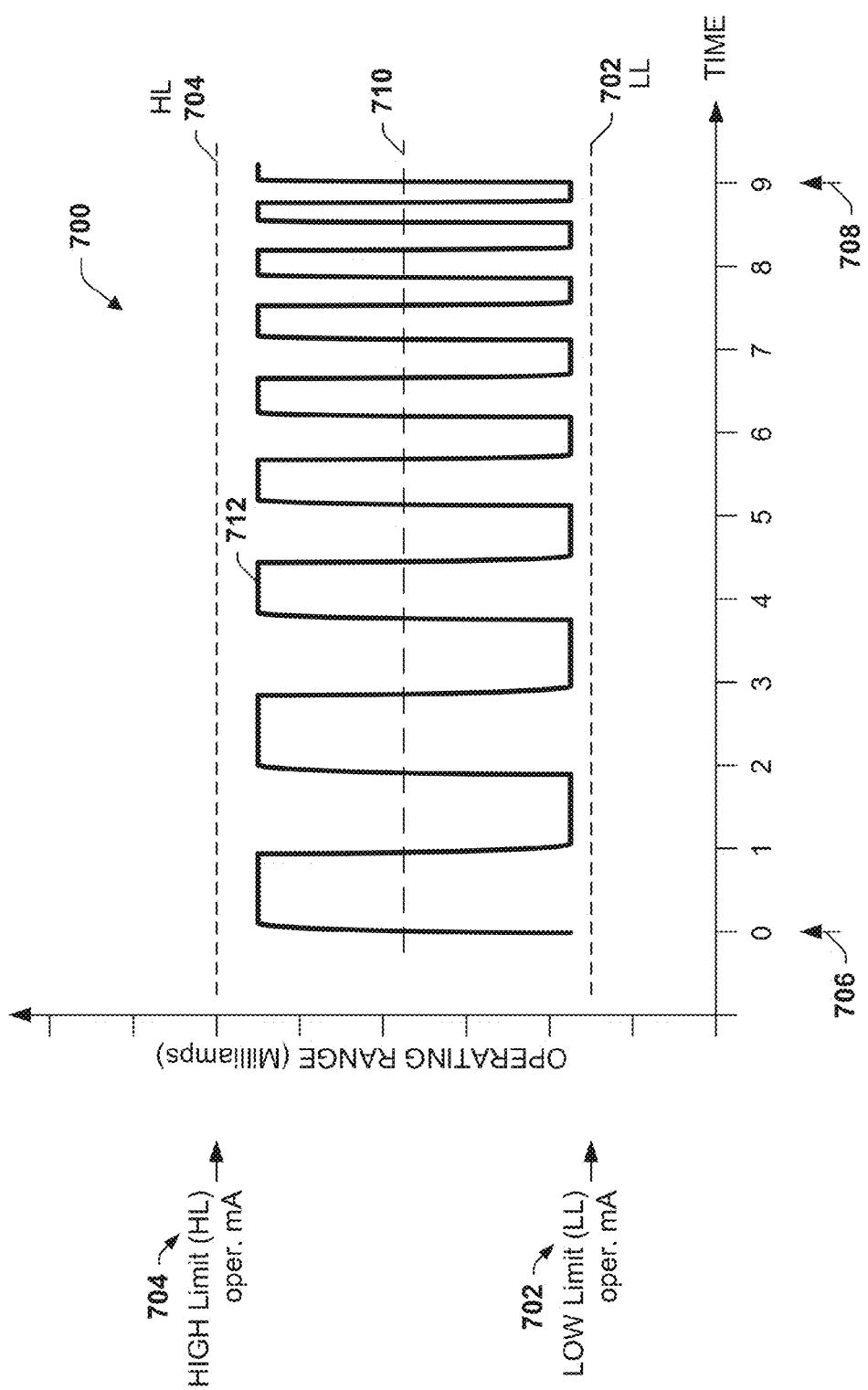

Plot 700 of FIG. 7 illustrates an exemplary Anti-lock Braking System (ABS) wheel speed sensor example, and one possible milliampere output vs. time plot 712. Low limit LL 702 and HL 704 current levels are not specified in this example but instead demonstrate exemplary upper and lower current range bounds, while the typical, median or average level 710 is likely centered within these range bounds. For example, ABS sensor output plot 712, illustrates that between initial time "0" at 706 and time "2", the wheel speed sensor pulses once making a single complete waveform cycle, and then another between about times "2" and time "3.7". Thereafter, the wheel speed sensor appears to progressively speed up thru time "9" at 708, progressively shortening the pulse width. Thus, the ABS sensor is indicating that the wheel being sensed is accelerating, as seen by the on-board computer or vehicle computer (e.g., 102).

The output signal plot 712 of the ABS wheel speed sensor may be produced by rapidly accelerating the rotational speed (RPMs) of the particular wheel associated with a known good wheel speed sensor, or may be produced by ABS sensor simulation using the sensor simulator 302 of ADS 200. Using the ABS sensor simulation of sensor simulator 302 of ADS 200/250, can thereby test the vehicle on board computer 102 (and/or the assigned input of the computer 102 responsible for this ABS sensor), the vehicle sensor wiring harness (e.g., 110), and to thereby test by elimination, the ABS sensor system being simulated. That is, if an ABS sensor problem is reported (e.g., on/by vehicle computer 102) while using the suspect ABS sensor, but is not reported when the ABS sensor is simulated, then the user could conclude or diagnose, based on the ADS 200/250 simulation results, that the ABS sensor is defective.

On the other hand, if an ABS sensor problem is reported (e.g., by vehicle computer 102) while using the suspect ABS sensor, but also reports the same ABS sensor problem when the ABS sensor is simulated, then the user would conclude or diagnose, based on the ADS 200/250 simulation results, that either the vehicle computer 102 is defective, and/or that the vehicle sensor wiring harness 110 is defective. One further exemplary test may then be performed to further eliminate or diagnose that a problem exists in the vehicle sensor wiring harness 110, by first determining that the vehicle computer 102 is OK, by using a diagnostic scanner tool to determine the acceptable operations of several functions or sensors not associated with the suspect sensor; and then determining if the simulated operation of the suspect sensor as presented to the vehicle computer 102 indicates that the simulated operation of the suspect sensor is not OK.

Figure 8:
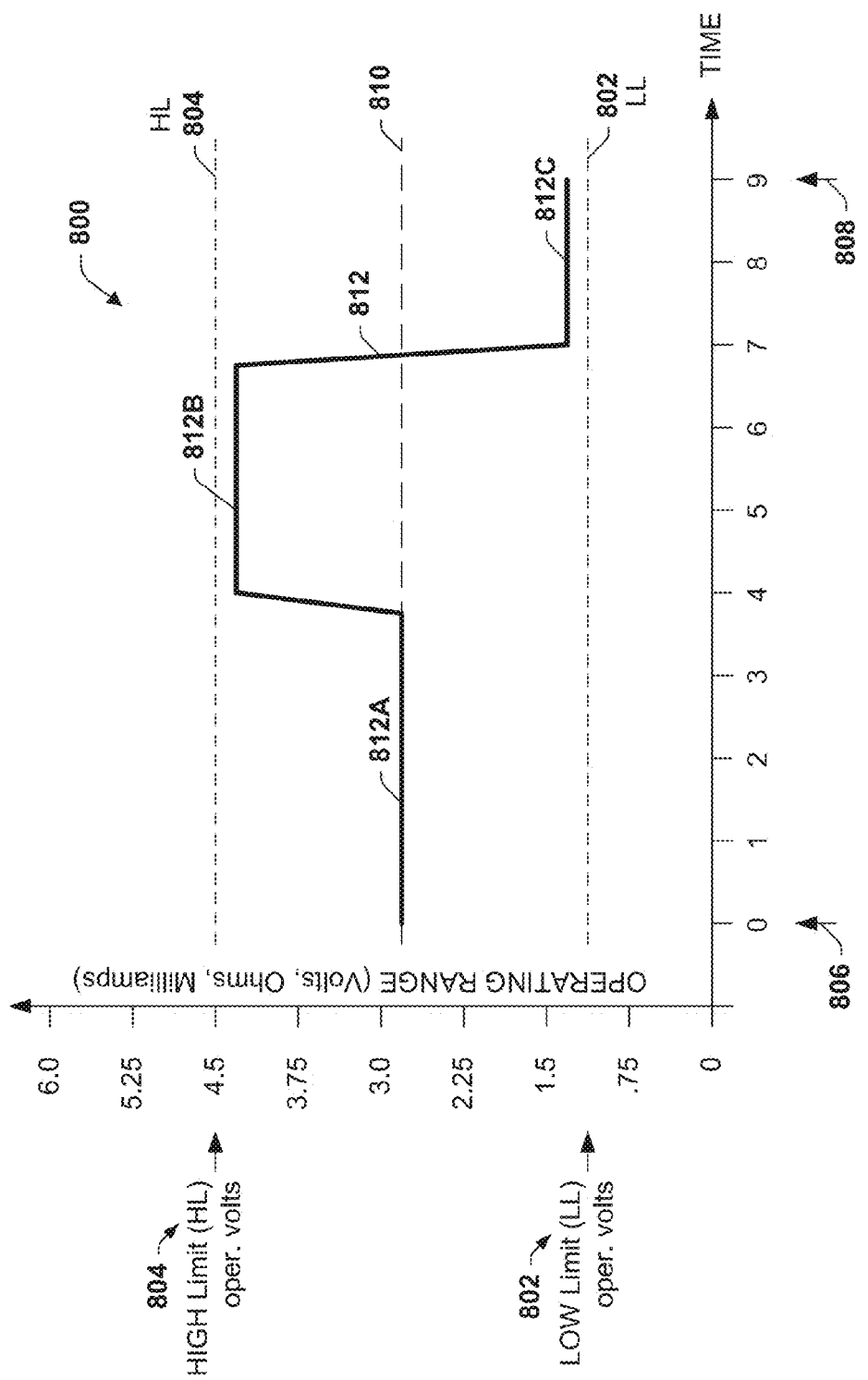

Plot 800 of FIG. 8 illustrates one possible voltage output vs. time plot 812, for one or more exemplary sensors, such as a Manifold Absolute Pressure Sensor (MAPS) Sensor. Simply for the purpose of illustration, Low limit LL 802 may be established at about 1.1 Volts, and a high limit HL 804 at about 4.5 Volts, and a typical or average voltage level 810 at about 2.8 Volts. For example, sensor output plot 812A, illustrates that initially at time "0" 806, the MAPS sensor is indicating that the engine is aspirating a medium level 810 of air flow such as at medium engine RPM's at 80° F., for example. Then at about time "4", the sensor output quickly ramps up to a very high air flow plateau 812B (e.g., indicating a high engine RPM), until about time "7", when the sensor quickly drops down to a low output level 812C until final time "9" at 808 (e.g., indicating a very low air flow and engine RPM).

Again, the MAPS or another such known good sensor, may be simulated (e.g., 512A, 512D, 512E, 612A/D, 712, 812) by sensor simulator 302 of ADS 200/250, and may also be represented as remaining near a known typical, median or average level 810, or transitioning between any two or more other known levels similar to plot 812 of FIG. 8.

Thus, in one embodiment, the automotive diagnostic system ADS 200/250 of FIGS. 2 & 3A/3B, is configured for diagnosing problems in one or more of a sensor (e.g., 131 or sensor system 130), a vehicle computer 102 and a vehicle sensor wiring harness 110. During normal vehicle operations the vehicle sensor wiring harness (e.g., 110 of FIGS. 1 &2) is coupled between the sensor (e.g., 130 or 131) and the vehicle computer 102. The automotive diagnostic system 200 comprises a sensor simulator 302 configured to be selectively coupled to the vehicle computer 102 having the vehicle sensor wiring harness 110 coupled therebetween during a diagnostic mode. The sensor simulator 302 is adapted to simulate an operation (e.g., 512A, 512D, 512E, 612A/D, 712, 812) of a selected sensor 130 (such as a user selected sensor or a suspect sensor) to the vehicle computer 102 independent of the selected sensor 130 or a connection means between the sensor 130 and the automotive diagnostic system 200/250. The ADS 200/250 further comprises an external computer 301 (non-vehicular computer 301) coupled to the sensor simulator 302 and adapted for controlling the sensor simulator 302 to selectively couple to the vehicle computer 102 and to simulate (e.g., 512A, 512D, 512E, 612A/D, 712, 812) the operation of the (user) selected sensor 130.

ADS 200/250 may also comprise a user keypad 220 coupled to the external computer 301 adapted to provide user inputs to the external computer 301; and a memory 230 coupled to the external computer 301, the memory 230 is adapted to store user input data associated with a range of vehicle manufacturer's makes, models, years, sensor 130 function types, and one or more of a voltage, current, and resistance operational range values (e.g., 502, 504, 510) of the selected sensor 130 to be simulated (e.g., 512A, 512D, 512E, 612A/D, 712, 812) (e.g., by sensor simulator 302). The external computer 301, keypad 220 and memory 230 are adapted to receive and store user input data (e.g., vehicle and sensor data pre-loaded, or loaded via the keyboard 220, uploaded directly to memory 230, etc.), associated with a selected manufacturers make, model, year vehicle, and the function type of the selected sensor (e.g., 130) to be simulated using the sensor simulator 302, and to enable the user to select or adjust a typical operational value (e.g., 510) of the selected sensor 130. The automotive diagnostic system 200/250 is further adapted to determine whether a problem exists in one or more of the sensor 130, vehicle computer 102, and the vehicle sensor wiring harness 110 and to diagnose the problem.

In one embodiment of the automotive diagnostic system 200/250, the vehicle sensor wiring harness 110 comprises a computer-side connector 112 for connection to the vehicle computer 102, a sensor-side connector 116 for connection to the sensor 130, and harness wiring 114 connected therebetween.

In one embodiment of the automotive diagnostic system 200/250, a diagnostic scanner is either one of utilized by, or incorporated into the sensor simulator 302 to provide vehicle computer indication (result indication of/from the vehicle computer 102) of the simulation (e.g., 512A/D, 612A/D, 712, 812) in coordination with the automotive diagnostic system 200/250.

In one embodiment of the automotive diagnostic system 200/250, the user provides the vehicle computer indication (result indication of/from the vehicle computer 102) resulting from the sensor simulation (e.g., 512A/D, 612A/D, 712, 812) to the automotive diagnostic system 200/250 by one or more of a user input to the keypad 220 after observation, or by choosing between two possible results displayed on a screen (e.g., 210) associated with the automotive diagnostic system 200/250.

In another embodiment, the automotive diagnostic system 200/250 comprises a user interface comprising a display (e.g., 210) configured to display alphanumeric characters or graphics representing one or more voltage, current and resistance measurements, and sensor operational range values associated with the sensor 130, and a plurality of pushbuttons for inputting and changing the sensor operational range values, for selecting one or more operational modes of the automotive diagnostic system 200/250, and for configuring one or more options of the automotive diagnostic system 200/250.

In one embodiment of the automotive diagnostic system 200/250, the sensor simulator 302 comprises at least one analog to digital (A/D) converter 310 coupled to the external computer 301, at least one digital to analog (D/A) converter 304 coupled to the external computer 301, and at least one multiplexor (e.g, 306) configured to selectively couple the digital to analog (D/A) converter to one of a plurality of wires 114 of the vehicle sensor wiring harness 110 that is connected to the vehicle computer 102, and/or at least one multiplexor (e.g, 308) configured to selectively couple the one of a plurality of wires 114 of the vehicle sensor wiring harness 110 that is connected to the vehicle computer 102, to the at least one analog to digital (A/D) converter 310.

In another embodiment the simulated operation (e.g., 512A/D, 612A/D, 712, 812) of the selected sensor 130 comprises one or more of the voltage, current or resistance operational range values (e.g., 502, 504, 510) as presented to the vehicle computer 102.

In one embodiment of the automotive diagnostic system 200/250, the sensor simulator 302 further comprises a clamping circuit 320 configured to shunt any noise, over-voltages and under-voltages on an I/O bus 314 (and on In1, In2 ... InN) associated with the sensor simulator 302, for example, to the power supply 322 and ground 324.

In one embodiment the sensor simulator 302 further comprises a clamping circuit 320 configured to receive a simulated sensor signal from the external computer 301 or a signal processor 301, and configured to shunt any noise, over-voltages or under-voltages on the simulated sensor signal to a supply voltage 322 or a ground voltage 324 associated with the automotive diagnostic system 200/250.

In one embodiment the automotive diagnostic system 200/250 is configured and operable to receive one or more initial parametric inputs associated with the selected sensor 130 provided by the sensor or automotive manufacturer.

In one embodiment of the automotive diagnostic system 200/250, the one or more initial parametric inputs provided by the manufacturer comprises one or more of a low limit (e.g., LL 502) and high limit (e.g., HL 504) voltage operational range value, a low limit (e.g., LL 502) and high limit (e.g., HL 504) current operational range value, a low limit (e.g., LL 502) and high limit (e.g., HL 504) resistance operational range value, a median voltage operational range value (e.g., 510), a median current operational range value (e.g., 510), a median resistance operational range value (e.g., 510), a voltage signal, a current signal, a resistance signal, a voltage response time, a current response time, a resistance response time, a minimum and maximum supply voltage (e.g., 322, 324), a vehicle set-point temperature, a sensor and controller model number, a sensor and controller serial number, a manufacturing date, and a calibration temperature.

In one embodiment, the automotive diagnostic system 200/250 is configured and operable to digitally and wirelessly communicate with one or more or a combination of wireless accessory modules, an RF transceiver, a router, a diagnostic scanner, a remote display, an alarm, an OBD2 compatible connector (e.g., at the vehicle computer 102), an OBD2 compatible cable 252, and a sensor 131. The exemplary automotive diagnostic system 200/250 may also comprise a communications or bus port, such as a 4 wire serial bus port to digitally communicate with the one or more or a combination of the wired and wireless accessory modules, an RF transceiver, a router, a remote display, etc.

For example, an RF transceiver or transceiver module may be used for wirelessly communicating with one or more or a combination sensors or OBD2 compatible connectors (e.g., at the vehicle computer 102), an OBD2 compatible cable 252, a remote display, etc. to provide a remote indication of the simulated sensor or a remote output connection of the simulated sensor to the vehicle computer 102. It will be appreciated that such communications between the automotive diagnostic system 200/250 and the vehicle computer 102 or a display may also be digitally communicated either by wired or wireless means.

In one embodiment, the automotive diagnostic system 200/250 comprises a supply voltage monitoring circuit, wherein the automotive diagnostic system is configured to measure the supply voltage 322 & 324 with the supply voltage monitoring circuit, and wherein the supply voltage monitoring circuit is operable to provide an indication to the automotive diagnostic system 200/250 if one of a supply voltage minimum and maximum conditions exists.

In one embodiment, the automotive diagnostic system 200/250 is adapted to determine whether a problem exists in one or more of the sensor 130, vehicle computer 102, and the vehicle sensor wiring harness 110 and to diagnose the respective problem.

In one embodiment, the selected sensor 130 comprises a user selected sensor, selected by the user of the automotive diagnostic system 200/250.

In one embodiment, the automotive diagnostic system comprises a sensor specific plug adapter 202 which connects directly between a receptacle 312 mounted on the sensor simulator 302 and the vehicle sensor wiring harness 110, the sensor specific plug adapter 202 configured to accommodate and interconnect a variety of vehicle sensor wiring harnesses 110 and their respective pin configurations (e.g., pin configuration on sensor connector 122 of sensor 130) to a single pin configuration of the receptacle 312 mounted on the sensor simulator 302.

In one embodiment, the automotive diagnostic system 200/250 further comprises one or more of an OBD2 connector (e.g., 251) and connection means (e.g., OBD2 cable 252) to an OBD2 connector at the vehicle computer 102 and a diagnostic scanner module (not shown), configured to simulate or generate diagnostic scanner functions and controls to the vehicle computer 102, and to provide coordination and communications between the vehicle computer 102 and the sensor simulator 302 of the automotive diagnostic system 200/250, by way of the OBD2 connector 251 and connection means (OBD2 cable 252) to an OBD2 connector at the vehicle computer 102.

In yet another embodiment, an automotive diagnostic system 200/250 for a vehicle, comprises a sensor simulator 302, adapted to be selectively coupled (e.g., by MUX 306/308, and/or included buffer/drivers) during a diagnostic mode to a vehicle computer 102 for the vehicle having a vehicle sensor wiring harness 110 coupled between the sensor simulator 302 and the vehicle computer 102. ADS 200/250 further comprises an external computer 301 adapted to control the sensor simulator 302 to be selectively coupled to the vehicle computer 102 by way of the vehicle sensor wiring harness 110 and during the diagnostic mode to simulate the operation (e.g., 512A/D, 612A/D, 712, 812) of the sensor 130/131 without a connector (e.g., 122) for the sensor nor any means of connection (e.g., 120) between the sensor and the automotive diagnostic system 200/250. ADS 200/250 also comprises a user keypad 220 coupled to the external computer 301, and adapted to receive user commands associated with a selected manufacturers make, model, year vehicle, and the function type of the sensor 130/131 to be simulated by the sensor simulator 302, and to enable the user to select or adjust a typical operational value (e.g., LL 502, HL 504, 510) of the sensor. ADS 200/250 further comprises a memory device coupled to the external computer, and adapted to store a range of vehicle manufacturer's makes, models, years, sensor function types, and voltage, current or resistance operational range values (e.g., LL 502, HL 504, 510) of the sensor to be simulated; wherein during a typical vehicle operations mode the vehicle sensor wiring harness 110 is coupled between the vehicle computer 102 and a sensor which is to be simulated (e.g., 512A/D, 612A/D, 712, 812).

In another embodiment, the automotive diagnostic system ADS 200/250 comprises a user interface comprising a display 210 configured to display alphanumeric characters or graphics, representing one or more voltage, current and resistance measurements, and sensor operational range values (e.g., LL 502, HL 504, 510) associated with the sensor 130/131, and a plurality of pushbuttons for inputting and changing the sensor operational range values (e.g., LL 502, HL 504, 510), for selecting one or more operational modes of the ADS 200/250, and for configuring one or more options of the ADS 200/250.

In still another embodiment, the automotive diagnostic system 200/250 comprises a user interface comprising a display 210 configured to display alphanumeric characters or graphics, representing one or more of a vehicle manufacturer's make, model, year, sensor function type, and one or more of a voltage, current or resistance operational range value (e.g., LL 502, HL 504, 510) of the sensor associated with the vehicle, and a user keypad 220 adapted to receive user commands associated with a selected manufacturers make, model, year vehicle, and the function type of the sensor to be simulated (e.g., 512A/D, 612A/D, 712, 812) using the sensor simulator 302, and to enable the user to select or adjust a typical operational value (e.g., 510) of the sensor to be simulated.

In another embodiment, the automotive diagnostic system ADS 200/250 is further adapted to be selectively coupled (e.g., by MUX 306/308 and/or included buffer/drivers) during a sensor diagnostic mode, directly to a suspect sensor 130/131, to measure and evaluate the health of the sensor 130/131, and to provide sensor safety or failure prediction information based on a comparison between the output measurements and the evaluations (of the suspect sensor 130/131), and the respective stored data of the (known good) simulated sensor provided by the sensor simulator 302 of the ADS 200/250, thereby providing comparison data that may indicate marginal or changing sensor parameters to help maintain safe vehicle operations by avoiding an impending sensor failure.

In another embodiment, the automotive diagnostic system ADS 200/250 further comprises an at least two position switch (such as an A/B switch with two or three positions, not shown) configured to select between the simulated sensor output (e.g., 512A/D, 612A/D, 712, 812) of the sensor simulator (e.g., 302) and the output of the suspect sensor (e.g., 130/131), the switch further configured to provide the output selection (e.g., at the throw or common of the switch) to the vehicle computer (e.g., 102) by way of the vehicle sensor wiring harness (e.g., 110).

For example, in this embodiment, when the suspect sensor is connected to the ADS 200/250, a comparison can now be made between the characteristics of the suspect sensor and the characteristics of the known good simulated sensor, for example, as stored in the memory 230 of the ADS 200/250. For example, although the results of this comparison test may indicate that the suspect sensor falls within expected limits, the results may also indicate that the characteristics are quite marginal or are very close to the allowable limits of the parameters for which the suspect sensor is judged. This marginal performance result of the suspect sensor can be used by the diagnostic technician (user) to better determine whether the suspect sensor is approaching an impending failure condition, and therefore better used to decide whether the sensor poses a safety risk to certain vehicle operations. Thus, ADS 200/250 can be used to evaluate the health of the sensor, to provide sensor safety or failure prediction information to help maintain safe vehicle operations by avoiding an impending sensor failure.

Further, if the +12V or Gnd, conditions are not correctly indicated at the expected pins at the input pin/connections of the automotive diagnostic system 200/250, the vehicle sensor wiring harness 110 would fail the diagnostic test. Also, if the vehicle sensor wiring harness 110, as tested by the automotive diagnostic system 200/250, indicates a high impedance connection, the vehicle sensor wiring harness 110 would fail the diagnostic test. In this way, ADS 200/250 can be used to help maintain safe vehicle operations, by avoiding an impending failure condition in the vehicle sensor wiring harness 110 as well as the suspect sensor 131 or sensor system 130.

Figure 9A:
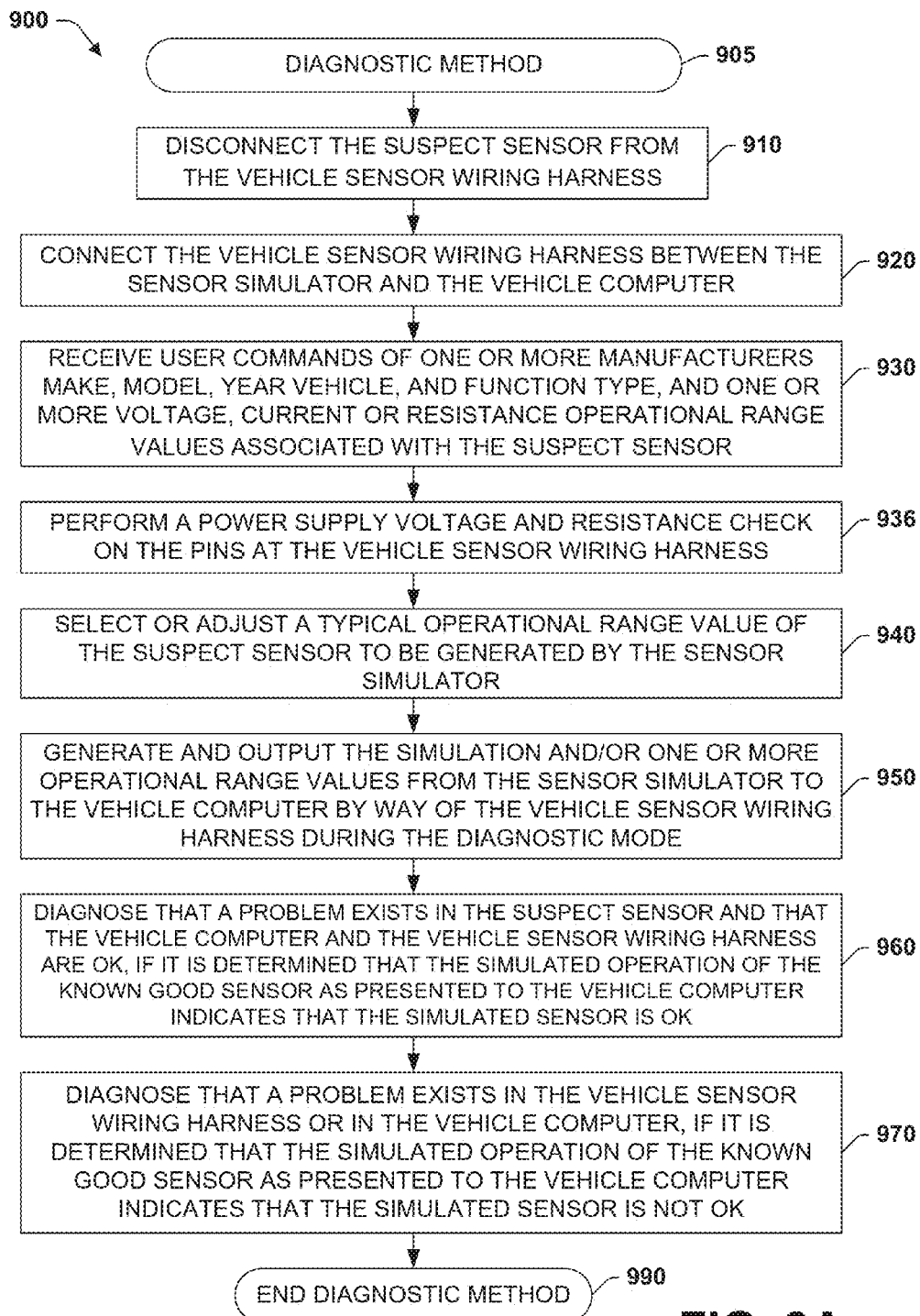
FIGS. 9A and 9B are flow diagrams illustrating a method of diagnosing problems in a suspect sensor, a vehicle sensor wiring harness and a vehicle computer of a vehicle without any connection to the sensor, by replacing and simulating the sensor during a diagnostic mode, such as may be accomplished in the automotive diagnostic systems of FIGS. 2 and 3A/3B in accordance with one or more embodiments of the present invention.
Figure 9B:
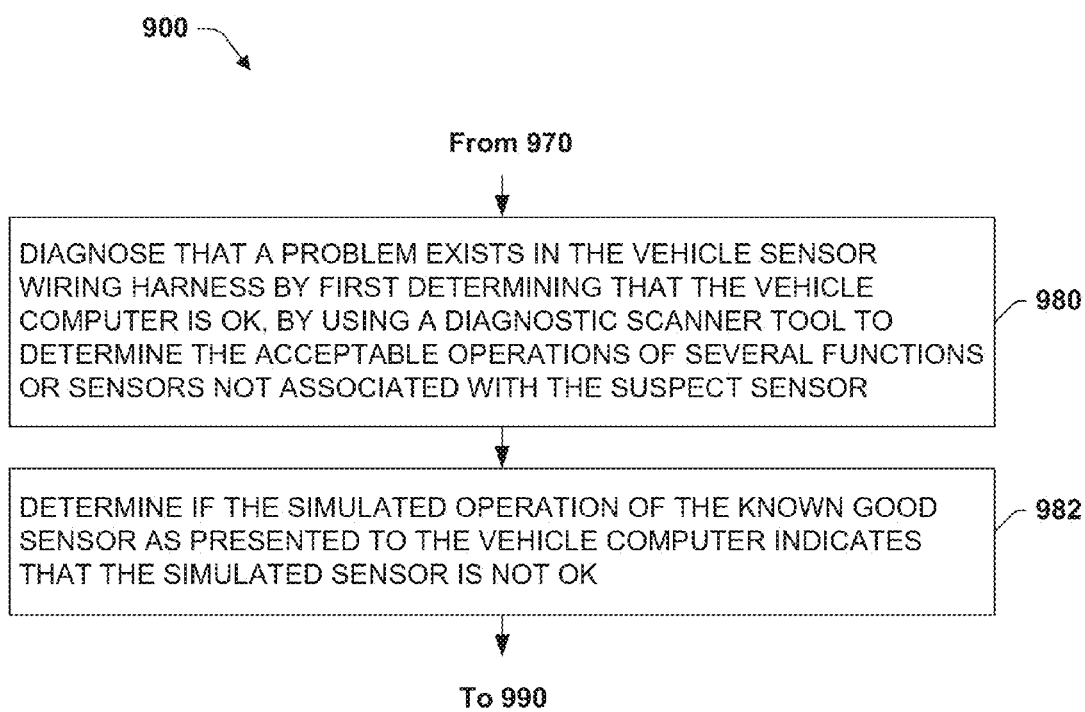

FIGS. 9A and 9B illustrate a flow diagram of a method 900 of diagnosing problems in a suspect sensor 130/131, a vehicle sensor wiring harness 110 and a vehicle computer 102 of a vehicle without any connection to the sensor, for example, by replacing and simulating the sensor during a diagnostic mode, such as may be accomplished in the automotive diagnostic systems 200 and 250 of FIGS. 2 and 3A/3B in accordance with one or more embodiments of the present invention. It is to be appreciated that a "diagnostic mode" is first assumed to be in affect, when the user has at least determined that there is a problem in the automotive sensor system (e.g., 100 of FIG. 1).

While the method 900 is illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention. Furthermore, the method 900 according to the present invention may be implemented in association with the automotive diagnostic system, the vehicle sensor and sensor systems, the diagnostic system controller, the sensor simulator, the vehicle computer and vehicle electrical systems, and other devices illustrated and described herein as well as in association with other systems, elements, and devices not illustrated.

The present invention provides an exemplary method 900 of diagnosing problems in a suspect sensor (e.g., suspect sensor 131 or sensor system 130), a vehicle sensor wiring harness (e.g., 110) and a vehicle computer (e.g., 102) of a vehicle without any connection to the sensor (e.g., 130/131) by replacing and simulating (e.g., 512A, 512D, 512E, 612A/D, 712, 812) the operation of the known good sensor using an automotive diagnostic system (e.g., ADS 200/250) comprising a sensor simulator (e.g., 302) configured to be selectively coupled to the vehicle computer (e.g., 102) by way of the vehicle sensor wiring harness (e.g., 110) coupled therebetween during a diagnostic mode using an automotive diagnostic system (e.g., ADS 200/250). The simulated operation of the known good sensor is also known herein as the sensor simulation or the simulated sensor.

In one embodiment, the exemplary diagnostic method 900 of FIG. 9A begins at 905, and then at 910 comprises disconnecting the suspect sensor (e.g., 130/131) from the vehicle sensor wiring harness (e.g., 110) of the vehicle, for example. For example, initially, the user disconnects the suspect sensor (e.g., 130/131) from the vehicle sensor system (e.g., 100) after the vehicle sensor wiring harness 110 of the sensor monitoring system (e.g., 101), in order to instead, plug-in the automotive diagnostic system ADS 200/250 including the sensor specific plug adapter 202 which plugs into the diagnostic system controller (e.g., 201) of ADS 200/250, thereby replacing the removed suspect sensor (e.g., 130/131) with the sensor simulator (e.g., 302).

At 920, the method 900 comprises connecting the vehicle sensor wiring harness (e.g., 110) between the sensor simulator (e.g., 302) and the vehicle computer (e.g., 102). For example, if during other associated testing, the vehicle sensor wiring harness (e.g., 110) was disconnected from the vehicle computer (e.g., 102), the vehicle sensor wiring harness (e.g., 110) is reconnected between the vehicle computer (e.g., 102) and the sensor simulator (e.g., 302) of the automotive diagnostic system ADS 200/250.

At 930, the method 900 further comprises receiving user commands (e.g., using keypad 220, and storing them in memory 230) of one or more of a manufacturers make, model, year vehicle, and function type, and one or more voltage, current or resistance operational range values (e.g., LL 502, HL 504, 510) associated with the suspect sensor (e.g., 130/131). For example, a diagnostic technician or user may use the keypad 220 and display 210 to select the above data associated with a vehicle under test from a library of such sensor data that was preloaded into the ADS system memory 230, or the user may manually enter the above data from a printed library. Presumably, this library of sensor data would include all sensors types associated with a list of most vehicles, makes, models, etc., and would further include one or more known good sensor simulations, operational range values and limits (e.g., LL 502, HL 504, 510) associated with the suspect sensor (e.g., 130/131) which is to be simulated (e.g., 512A, 512D, 512E, 612A/D, 712, 812).

At 936, the method 900 comprises the ADS 200/250 performing a basic voltage supply and resistance check of the vehicle sensor wiring harness (e.g., 110) since it is connected to the vehicle computer (e.g., 102). For example, this test may take-on two forms: an Ignition-Off check, and an ignition-On check. That is, initially, during the Ignition-Off check, and then the ignition-On check; some resistances and voltages can be detected or otherwise measured by the ADS 200/250 (e.g., by the A/D 310) to insure that the vehicle sensor wiring harness (e.g., 110) and the vehicle computer 102 appear to check OK, before the simulation signals are generated by the sensor simulator (e.g., 302) of the automotive diagnostic system ADS 200/250.

For example, the ADS 200/250 is configured and operable, in these voltage and resistance checks, to determine that the +12V and Gnd voltages are present on a predetermined number of pins of the sensor specific plug adapter 202 for the respective sensor being simulated at the universal receptacle 312. Further, other predetermined pins of adapter 202 should/may also indicate, for example, a reference voltage or reference current as provided by the vehicle computer 102 for the respective sensor being simulated or simulated sensor. Thus, if these supply voltages and/or reference voltages/currents are not present at the sensor specific plug adapter 202 for the respective sensor being simulated, then the ADS 200/250 would advise the user to not proceed with the sensor simulation step, but would instead advise that either the vehicle sensor wiring harness (e.g., 110) or the vehicle computer (e.g., 102) is defective. In this case, the ADS 200/250 may then also advise the user to begin a basic resistance check of the vehicle sensor wiring harness (e.g., 110) for open or shorted circuit wiring, for example, and/or for related blown vehicle circuit fuses.

At 940, the method 900 further comprises selecting or adjusting the sensor simulator (e.g., 302) to an operational range value (e.g., LL 502, HL 504, 510) for a known good (fully operational) sensor. For example, the user may keyboard enter, select or adjust one or more of the LL 502 or HL 504 operational range limits for a sensor that is to be simulated, for example, to test the effect on vehicle performance, to determine what operational range limit is necessary to match the performance observed when the suspect sensor is used, or simply to add testing flexibility for other such tests which may be determined at a later date.

At 950, the method 900 further comprises generating and outputting at least one of the one or more operational range values (e.g., LL 502, HL 504, 510) and a simulation (e.g., 512A, 512D, 512E, 612A/D, 712, 812) from the sensor simulator (e.g., 302) to the vehicle computer (e.g., 102) by way of the vehicle sensor wiring harness (e.g., 110) during the diagnostic mode. In this step, the sensor simulator (e.g., 302) finally generates and outputs a simulation (e.g., 512A, 512D, 512E, 612A/D, 712, 812) of a known good sensor, or at least an operational range value (e.g., 510, 610, 710, 810) within the range limits (e.g., LL 502, HL 504), such as was selected or adjusted in step 940.

At 960, the method 900 further comprises diagnosing that a problem exists in the suspect sensor (e.g., 130/131) and that the vehicle computer (e.g., 102) and the vehicle sensor wiring harness (e.g., 110) are OK, if it is determined that the simulated operation (e.g., 512A, 512D, 512E, 612A/D, 712, 812) (simulated sensor or sensor simulation) of the known good sensor as presented to the vehicle computer (e.g., 102) indicates that the simulated sensor (e.g., 512A, 512D, 512E, 612A/D, 712, 812) is OK. That is, for example, if the sensor simulation (e.g., 512A, 512D, 512E, 612A/D, 712, 812) of the known good sensor (simulated sensor) tests OK (as seen by the vehicle computer 102), while the vehicle's suspect sensor fails the test, then the ADS 200/250 will advise the user (or it will otherwise be appreciated) that the vehicle suspect sensor has failed, but that the vehicle computer (e.g., 102) and the vehicle sensor wiring harness (e.g., 110) are OK. The ADS 200/250 can also advise the user, for example, based on a determination that the simulation and/or operational range values are communicated or received at the vehicle computer (OK), within the typical or acceptable limits of operational range values, and thus that the vehicle computer 102 and the vehicle sensor wiring harness 110 are OK.

At 970, the method 900 further comprises diagnosing that a problem exists in the vehicle sensor wiring harness (e.g., 110) or in the vehicle computer (e.g., 102), if it is determined that the simulated operation of the known good sensor (e.g., 512A, 512D, 512E, 612A/D, 712, 812) as presented to the vehicle computer (e.g., 102) indicates that the simulated sensor (e.g., 512A, 512D, 512E, 612A/D, 712, 812) is not OK. This conclusion may be made, because both the suspect sensor and the known good sensor (simulated sensor) is expected to pass the diagnostic test, thus, it is logical to conclude that a problem/failure exists in either the vehicle sensor wiring harness (e.g., 110) or the vehicle computer (e.g., 102). However, it should also be remembered that previously at 936, the power supply voltages and resistance checks have already been completed successfully. Thus, to get to this step 970, at least some of the pins of the vehicle sensor wiring harness (e.g., 110) have already been verified as being OK.

In another embodiment, the exemplary diagnostic method 900 continues from step 970 of FIG. 9A to step 980 of FIG. 9B, further comprising diagnosing that a problem exists in the vehicle sensor wiring harness (e.g., 110) by first determining that the vehicle computer (e.g., 102) is OK, by using a diagnostic scanner tool to determine the acceptable operations of several functions or sensors not associated with the suspect sensor (e.g., 130/131), and then at 982 determining if the simulated operation of the known good sensor as presented to the vehicle computer indicates that the simulated sensor is not OK. Thereafter, the method 900 may continue back to step 990 of FIG. 9A. By eliminating the vehicle computer 102 (as being OK), and by now determining that the simulated sensor is not OK (even though it simulates a known good sensor), the user may now reasonably conclude that a problem exists in the vehicle sensor wiring harness (e.g., 110). Otherwise, if in the above diagnostic scanner tool test, it may also be determined that the vehicle computer 102 is not OK, thereby identifying this as the problem.

Although the invention has been illustrated and described with respect to one or more implementations, equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising."

What is claimed is:

1. An automotive diagnostic system for diagnosing problems in a sensor system, a vehicle computer and a vehicle sensor wiring harness, wherein during normal vehicle operations the vehicle sensor wiring harness is coupled between the sensor and the vehicle computer, the automotive diagnostic system comprising:

a sensor simulator configured to be selectively coupled to the vehicle computer having the vehicle sensor wiring harness coupled therebetween during a diagnostic mode, the sensor simulator adapted to simulate an operation of the sensor system to the vehicle computer, and to physically replace the sensor system;

an external computer coupled to the sensor simulator and adapted for controlling the sensor simulator to selectively couple to the vehicle computer and to simulate the operation of the selected sensor;

a user keypad coupled to the external computer adapted to provide user inputs to the external computer; and a memory coupled to the external computer, adapted to store user input data associated with a range of vehicle manufacturer's makes, models, years, sensor function types, and one or more of a voltage, current, and resistance operational range values of the selected sensor to be simulated;

wherein the external computer, keypad and memory are adapted to receive and store user input data associated with a selected manufacturers make, model, year vehicle, and the function type of the selected sensor to be simulated using the sensor simulator, and to enable the user to select or adjust a typical operational value of the selected sensor; and wherein the automotive diagnostic system is adapted to determine whether a problem exists in one or more of the sensor, vehicle computer, and the vehicle sensor wiring harness and to diagnose the problem and wherein the automotive diagnostic system is configured to:

a) diagnose that a problem exists in the selected sensor and that the vehicle computer and the vehicle sensor wiring harness are OK, by determining if the simulated operation of the selected sensor as presented to the vehicle computer indicates that the selected sensor is OK;

b) diagnose that a problem exists in the vehicle sensor wiring harness or in the vehicle computer, by determining if the simulated operation selected sensor as presented to the vehicle computer indicates that the selected sensor is not OK; and c) diagnose that a problem exists in the vehicle computer by determining if there is no change in the vehicle computer indications between the simulated operation of the selected sensor and no simulated operation of the selected sensor and further configured to diagnose and determine that a problem exists in the vehicle computer, if there is no change in the vehicle computer indication between the sensor being connected to the vehicle sensor wiring harness and the sensor being disconnected from the vehicle sensor wiring harness.

2. The automotive diagnostic system of claim 1, wherein the vehicle sensor wiring harness comprises a computer-side connector for connection to the vehicle computer, a sensor-side connector for connection to the sensor system, and harness wiring connected therebetween, and wherein the sensor system, comprises the simulated sensor, a sensor connector, and a sensor cable connected therebetween.

3. The automotive diagnostic system of claim 1, wherein a diagnostic scanner is either one of utilized by, or incorporated into the sensor simulator to provide the vehicle computer indication of the simulation in coordination with the automotive diagnostic system.

4. The automotive diagnostic system of claim 1, wherein the user provides the vehicle computer indication resulting from the sensor simulation to the automotive diagnostic system by one or more of a user input to the keypad after observation, or by choosing between two possible results displayed on a screen associated with the automotive diagnostic system.

5. The automotive diagnostic system of claim 1, wherein the automotive diagnostic system further comprises a user interface comprising:

a display configured to display alphanumeric characters or graphics representing one or more voltage, current and resistance measurements, and sensor operational range values associated with the sensor, and a plurality of pushbuttons for inputting and changing the sensor operational range values, for selecting one or more operational modes of the automotive diagnostic system, and for configuring one or more options of the automotive diagnostic system.

6. The automotive diagnostic system of claim 1, wherein the sensor simulator comprises:
   at least one analog to digital (A/D) converter coupled to the external computer; and
   at least one digital to analog (D/A) converter coupled to the external computer; and
   at least one multiplexor configured to selectively couple the digital to analog (D/A) converter to one of a plurality of wires of the vehicle sensor wiring harness that is connected to the vehicle computer; and
   at least one multiplexor configured to selectively couple the one of a plurality of wires of the vehicle sensor wiring harness that is connected to the vehicle computer, to the at least one analog to digital (A/D) converter.

7. The automotive diagnostic system of claim 1, wherein the simulated operation of the selected sensor comprises one or more of the voltage, current or resistance operational range values as presented to the vehicle computer.

8. The automotive diagnostic system of claim 1, wherein the automotive diagnostic system is configured and operable to receive one or more initial parametric inputs associated with the selected sensor provided by the sensor or automotive manufacturer.

9. The automotive diagnostic system of claim 8, wherein the one or more initial parametric inputs provided by the manufacturer comprises one or more of a low limit and high limit voltage operational range value, a low limit and high limit current operational range value, a low limit and high limit resistance operational range value, a median voltage operational range value, a median current operational range value, a median resistance operational range value, a voltage signal, a current signal, a resistance signal, a voltage response time, a current response time, a resistance response time, a minimum and maximum supply voltage, a vehicle set-point temperature, a sensor and controller model number, a sensor and controller serial number, a manufacturing date, and a calibration temperature.

10. The automotive diagnostic system of claim 1, wherein the automotive diagnostic system is configured and operable to digitally and wirelessly communicate with one or more or a combination of wireless accessory modules, an RF transceiver, a router, a diagnostic scanner, a remote display, an alarm, an OBD2 compatible connector, an OBD2 compatible cable, and a sensor.

11. The automotive diagnostic system of claim 1, further comprising a supply voltage monitoring circuit,
   wherein the automotive diagnostic system is configured to measure the supply voltage with the supply voltage monitoring circuit, and
   wherein the supply voltage monitoring circuit is operable to provide an indication to the automotive diagnostic system if one of a supply voltage minimum and maximum conditions exists.

12. The automotive diagnostic system of claim 1, wherein the automotive diagnostic system is adapted to determine whether a problem exists in one or more of the sensor, vehicle computer, and the vehicle sensor wiring harness and to diagnose the respective problem.

13. The automotive diagnostic system of claim 1, wherein the selected sensor is a user selected sensor, selected by the user of the automotive diagnostic system.

14. The automotive diagnostic system of claim 1, comprising a sensor specific plug adapter which connects directly between a receptacle mounted on the sensor simulator and the vehicle sensor wiring harness, the sensor specific plug adapter configured to accommodate and interconnect a variety of vehicle sensor wiring harnesses and their respective pin configurations to a single pin configuration of the receptacle mounted on the sensor simulator.

15. The automotive diagnostic system of claim 1, further comprising one or more of an OBD2 connector and connection means to the vehicle computer and a diagnostic scanner module, configured to simulate or generate diagnostic scanner functions and controls to the vehicle computer, and to provide coordination and communications between the vehicle computer and the sensor simulator of the automotive diagnostic system, by way of the OBD2 connector and connection means to an OBD2 connector at the vehicle computer.

16. An automotive diagnostic system for diagnosing problems in a sensor system a vehicle computer and a vehicle sensor wiring harness, wherein during normal vehicle operations the vehicle sensor wiring harness is coupled between the sensor and the vehicle computer, the automotive diagnostic system comprising:
   a sensor simulator configured to be selectively coupled to the vehicle computer having the vehicle sensor wiring harness coupled therebetween during a diagnostic mode, the sensor simulator adapted to simulate an operation of the sensor system to the vehicle computer, and to physically replace the sensor system, wherein the sensor simulator further comprises a clamping circuit configured to shunt any noise, over-voltages and under-voltages on an I/O bus associated with the sensor simulator;
   an external computer coupled to the sensor simulator and adapted for controlling the sensor simulator to selectively couple to the vehicle computer and to simulate the operation of the selected sensor;
   a user keypad coupled to the external computer adapted to provide user inputs to the external computer; and
   a memory coupled to the external computer, adapted to store user input data associated with a range of vehicle manufacturer's makes, models, years, sensor function types, and one or more of a voltage, current, and resistance operational range values of the selected sensor to be simulated;
   wherein the external computer, keypad and memory are adapted to receive and store user input data associated with a selected manufacturers make, model, year vehicle, and the function type of the selected sensor to be simulated using the sensor simulator, and to enable the user to select or adjust a typical operational value of the selected sensor; and
   wherein the automotive diagnostic system is adapted determine whether a problem exists in one or more of the sensor vehicle computer, and the vehicle sensor wiring harness and to diagnose the problem.

17. An automotive diagnostic system for diagnosing problems in a sensor system, a vehicle computer and a vehicle sensor wiring harness, wherein during normal vehicle operations the vehicle sensor wiring harness is coupled between the sensor and the vehicle computer, the automotive diagnostic system comprising:
   a sensor simulator configured to be selectively coupled to the vehicle computer having the vehicle sensor wiring harness coupled therebetween during a diagnostic mode, the sensor simulator adapted to simulate an operation of the sensor system to the vehicle computer, and to physically replace the sensor system, wherein the sensor simulator further comprises a clamping circuit configured to receive a simulated sensor signal from the external computer or a signal processor, and configured to shunt any noise, over-voltages or under-voltages on the simulated sensor signal to a supply voltage or a ground voltage associated with the automotive diagnostic system;

an external computer coupled to the sensor simulator and adapted for controlling the sensor simulator to selectively couple to the vehicle computer and to simulate the operation of the selected sensor;

a user keypad coupled to the external computer adapted to provide user inputs to the external computer; and a memory coupled to the external computer, adapted to store user input data associated with a range of vehicle manufacturer's makes, models, years, sensor function types, and one or more of a voltage, current, and resistance operational range values of the selected sensor to be simulated;

wherein the external computer, keypad and memory are adapted to receive and store user input data associated with a selected manufacturers make, model, year vehicle, and the function type of the selected sensor to be simulated using the sensor simulator, and to enable the user to select or adjust a typical operational value of the selected sensor; and wherein the automotive diagnostic system is adapted to determine whether a problem exists in one or more of the sensor vehicle computer and the vehicle sensor wiring harness and to diagnose the problem.

\* \* \* \* \*